United States Patent
Poghosyan et al.

(10) Patent No.: US 10,452,665 B2
(45) Date of Patent: Oct. 22, 2019

(54) METHODS AND SYSTEMS TO REDUCE TIME SERIES DATA AND DETECT OUTLIERS

(71) Applicant: VMware, Inc., Palo Alto, CA (US)

(72) Inventors: Arnak Poghosyan, Yerevan (AM); Ashot Nshan Harutyunyan, Yerevan (AM); Naira Movses Grigoryan, Yerevan (AM)

(73) Assignee: VMware, Inc., Palo Alto, CA (US)

(*) Notice: Subject to any disclaimer, the term of this patent is extended or adjusted under 35 U.S.C. 154(b) by 297 days.

(21) Appl. No.: 15/627,987

(22) Filed: Jun. 20, 2017

(65) Prior Publication Data
US 2018/0365298 A1   Dec. 20, 2018

(51) Int. Cl.
*H03M 7/30* (2006.01)
*G06K 9/62* (2006.01)
(Continued)

(52) U.S. Cl.
CPC ...... *G06F 16/2462* (2019.01); *G06F 16/2282* (2019.01); *G06F 16/2477* (2019.01);
(Continued)

(58) Field of Classification Search
CPC .......... G06F 16/2462; G06F 16/2477; G06F 16/2282; G06F 17/18; G06F 11/00;
(Continued)

(56) References Cited

U.S. PATENT DOCUMENTS 6,466,877 B1 * 10/2002 Chen .................... G01N 33/346
                                                              702/35
6,498,993 B1 * 12/2002 Chen ........................ D21F 7/04
                                                              702/35
(Continued)

FOREIGN PATENT DOCUMENTS

CN        102360378 A   *  2/2012
EP          3107000 A2   * 12/2016    ............. G06F 17/18

OTHER PUBLICATIONS

Gogoi et al. "A Survey of Outlier Detection Methods in Network Anomaly Identification." The Computer Journal, vol. 54, Issue 4, Apr. 2011, pp. 570-588. (Year: 2011).*
(Continued)

*Primary Examiner* — Phuong Thao Cao

(57) ABSTRACT

Automated methods and systems to reduce the size of time series data while maintaining outlier data points are described. The time series data may be read from a data-storage device of a physical data center. Clusters of data points of the time series data are determined. A normalcy domain of the time series data and outlier data points of the time series data is determined. The normalcy domain of the time series data comprises ranges of values associated with each clusters of data points. The outlier data points are located outside the ranges. Quantized time series data are computed from the normalcy domain. When the loss of information due to quantization is less than a limit, the quantized time series data is compressed. The time series
(Continued)

data in the data-storage device is replaced with the compressed time series data and outlier data points.

27 Claims, 32 Drawing Sheets

(51) Int. Cl.
    *G06F 17/18*     (2006.01)
    *G06F 16/2458*     (2019.01)
    *G06F 16/22*     (2019.01)
    *H03M 7/00*     (2006.01)
    *G06K 9/00*     (2006.01)
    *G06F 11/00*     (2006.01)

(52) U.S. Cl.
    CPC ......... *G06F 17/18* (2013.01); *G06K 9/00536* (2013.01); *G06K 9/6272* (2013.01); *G06K 9/6284* (2013.01); *H03M 7/00* (2013.01); *H03M 7/3059* (2013.01); *G06F 11/00* (2013.01); *H03M 7/30* (2013.01)

(58) Field of Classification Search
    CPC ............ G06K 9/00536; G06K 9/6284; G06K 9/6272; H03M 7/3059; H03M 7/00; H03M 7/30
    USPC ........................................................ 707/693
    See application file for complete search history.

(56) References Cited

U.S. PATENT DOCUMENTS

| | | | | |
|---|---|---|---|---|
| 6,522,978 | B1* | 2/2003 | Chen | G01N 33/346 702/182 |
| 8,171,033 | B2* | 5/2012 | Marvasti | G06F 17/18 702/160 |
| 8,676,964 | B2* | 3/2014 | Gopalan | H04L 41/142 370/230.1 |
| 9,742,435 | B1* | 8/2017 | Poghosyan | H03M 7/3064 |
| 2002/0038197 | A1* | 3/2002 | Chen | D21G 9/0009 702/182 |
| 2002/0052699 | A1* | 5/2002 | Chen | D21F 7/04 702/34 |
| 2004/0015458 | A1* | 1/2004 | Takeuchi | G06F 17/18 706/14 |
| 2004/0093364 | A1* | 5/2004 | Cheng | H03M 7/30 708/203 |
| 2006/0242706 | A1* | 10/2006 | Ross | G06F 21/55 726/23 |
| 2008/0027683 | A1* | 1/2008 | Middleton | G05B 23/0272 702/187 |
| 2010/0030544 | A1* | 2/2010 | Gopalan | H04L 41/142 703/13 |
| 2010/0082638 | A1* | 4/2010 | Marvasti | G06F 17/18 707/748 |
| 2010/0309031 | A1* | 12/2010 | Kawato | H01J 49/0036 341/87 |
| 2012/0041575 | A1* | 2/2012 | Maeda | G05B 23/024 700/80 |
| 2013/0110761 | A1* | 5/2013 | Viswanathan | G06N 20/00 706/52 |
| 2013/0116939 | A1* | 5/2013 | Dai | G06Q 50/06 702/45 |
| 2013/0166572 | A1* | 6/2013 | Fujimaki | G06Q 10/00 707/748 |
| 2013/0268288 | A1* | 10/2013 | Fujimaki | G06Q 10/10 705/2 |
| 2014/0298098 | A1* | 10/2014 | Poghosyan | G06F 11/3452 714/37 |
| 2015/0205692 | A1* | 7/2015 | Seto | G06F 11/3452 702/182 |
| 2016/0004620 | A1* | 1/2016 | Ohike | G06F 11/00 702/176 |
| 2016/0189041 | A1* | 6/2016 | Moghtaderi | G06N 20/00 706/12 |
| 2016/0313023 | A1* | 10/2016 | Przybylski | G05B 23/0297 |
| 2016/0371228 | A1* | 12/2016 | Ukil | G06F 17/18 |
| 2017/0070414 | A1* | 3/2017 | Bell | H04L 43/16 |
| 2017/0070415 | A1* | 3/2017 | Bell | H04L 43/16 |
| 2017/0109250 | A1* | 4/2017 | Matsuki | G06F 9/45558 |
| 2017/0181098 | A1* | 6/2017 | Shinohara | H04W 52/0261 |
| 2017/0315531 | A1* | 11/2017 | Aparicio Ojea | G05B 19/4183 |
| 2017/0359478 | A1* | 12/2017 | Deshpande | H04N 1/3217 |
| 2018/0324199 | A1* | 11/2018 | Crotinger | H04L 63/1425 |
| 2018/0348250 | A1* | 12/2018 | Higgins | G01P 5/00 |

OTHER PUBLICATIONS

Muthukirshnan et al. "Mining Deviants in Time Series Data Stream." Proceedings of the 16th International Conference on Scientific and Statistical Database Management (SSDBM'04), IEEE Computer Society, 2004, 10 pages. (Year: 2004).*

Weekley et al. "An Algorithm for Classification and Outlier Detection of Time-Series Data." Journal of Atmospheric and Oceanic Technology, vol. 27, Issue 1, Jan. 2010, pp. 94-107. (Year: 2010).*

Arthur, David, et al., "k-means++: The Advantages of Careful Seeding," 2007 Proceedings of the eighteenth annual ACM-SIAM symposium on Discrete algorithms. Society for Industrial and Applied Mathematics Philadelphia, PA, USA. pp. 1027-1035.

* cited by examiner

METHODS AND SYSTEMS TO REDUCE TIME SERIES DATA AND DETECT OUTLIERS

TECHNICAL FIELD

The present disclosure is directed to time series data reduction and detection of data point outliers in the time series data.

BACKGROUND

Electronic computing has evolved from primitive, vacuum-tube-based computer systems, initially developed during the 1940s, to modern electronic computing systems in which large numbers of multi-processor computer systems, such as server computers, work stations, and other individual computing systems are networked together with large-capacity data-storage devices and other electronic devices to produce geographically distributed computing systems with hundreds of thousands, millions, or more components that provide enormous computational bandwidths and data-storage capacities. These large, distributed computing systems are made possible by advances in computer networking, distributed operating systems and applications, data-storage appliances, computer hardware, and software technologies.

In order to proactively manage a distributed computing system, system administrators are interested in detecting anomalous behavior and identifying problems in the operation of the disturbed computing system. Management tools have been developed to collect time series data from various virtual and physical resources of the distributed computing system and processes the time series data to detect anomalously behaving resources and identify problems in the distributed computing system. However, each set of time series data is extremely large and recording many different sets of time series data over time significantly increases the demand for data storage, which increases data storage costs. Large sets of time series data also slow the performance of the management tool by pushing the limits of memory, CPU usage, and input/output resources of the management tool. As a result, detection of anomalies and identification of problems are delayed. System administrators seek methods and systems to more efficiently and effectively store and process large sets of time series data.

SUMMARY

The disclosure is directed to automated methods and systems to reduce the size of time series data produced by a resource of a distributed computing system while maintaining outlier data points. Examples of resources include virtual and physical resources, such as virtual and physical CPU, memory, data storage, and network traffic. The types of time series data include CPU usage, memory, data storage, and network traffic of a virtual or a physical resource. The time series data may be read from a data-storage device, such as a mass-storage array, of a physical data center. Clusters of data points of the time series data are determined. A normalcy domain of the time series data is determined. Data points located outside the normalcy domain of the time series data are identified as outlier data points. Quantized time series data are computed from the normalcy domain of the time series data. Loss of information between the quantized time series data and the normalcy domain of the time series data is computed. When the loss of information is less than or equal to a loss of information limit, the quantized time series data is compressed to obtain compressed time series data. The time series data in the data-storage device is replaced with the compressed time series data and outlier data points.

The methods automate the task of reducing the size of time series data stored in data-storage devices of a distributed computing system. The compressed time series data and outlier data points that replace the original time series data occupy less storage space than the original time series data, freeing storage space in the data-storage device. The smaller compressed time series data and outlier data points also enables faster and more timely analysis by a management server. For example, a management server can process the compressed time series data and outlier data points in real time or near real time to search for anomalous behavior of a resource or object, identify problems with the resource, and characterize the compressed time series data. In particular, an anomaly or problem may be identified from the outlier data points, because the outlier data points are retained. When an anomaly or problem is detected, the management server may generate an alert identifying the anomaly or problem, and because there is no significant delay, a system administrator is better able to respond accordingly.

DETAILED DESCRIPTION

Figure 1:
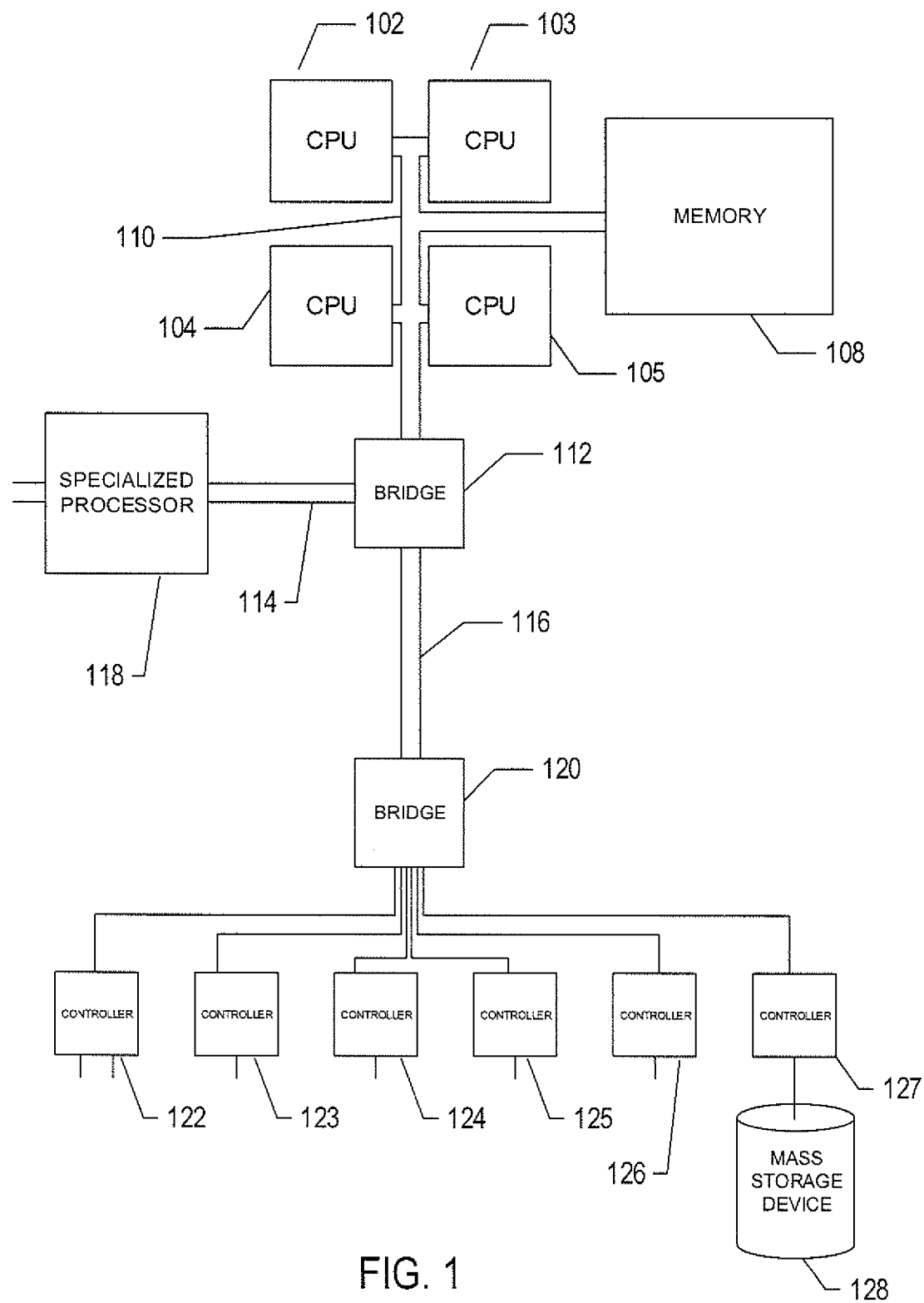
FIG. 1 shows a general architectural diagram for various types of computers.

This disclosure presents computational methods and systems to reduce time series data and detect outliers. In a first subsection, computer hardware, complex computational systems, and virtualization are described. Containers and containers supported by virtualization layers are described in a second subsection. Methods to reduce time series data and detect outliers are described below in a third subsection.

Computer Hardware, Complex Computational Systems, and Virtualization

The term "abstraction" is not, in any way, intended to mean or suggest an abstract idea or concept. Computational abstractions are tangible, physical interfaces that are implemented, ultimately, using physical computer hardware, data-storage devices, and communications systems. Instead, the term "abstraction" refers, in the current discussion, to a logical level of functionality encapsulated within one or more concrete, tangible, physically-implemented computer systems with defined interfaces through which electronically-encoded data is exchanged, process execution launched, and electronic services are provided. Interfaces may include graphical and textual data displayed on physical display devices as well as computer programs and routines that control physical computer processors to carry out various tasks and operations and that are invoked through electronically implemented application programming interfaces ("APIs") and other electronically implemented interfaces. There is a tendency among those unfamiliar with modern technology and science to misinterpret the terms "abstract" and "abstraction," when used to describe certain aspects of modern computing. For example, one frequently encounters assertions that, because a computational system is described in terms of abstractions, functional layers, and interfaces, the computational system is somehow different from a physical machine or device. Such allegations are unfounded. One only needs to disconnect a computer system or group of computer systems from their respective power supplies to appreciate the physical, machine nature of complex computer technologies. One also frequently encounters statements that characterize a computational technology as being "only software," and thus not a machine or device. Software is essentially a sequence of encoded symbols, such as a printout of a computer program or digitally encoded computer instructions sequentially stored in a file on an optical disk or within an electromechanical mass-storage device. Software alone can do nothing. It is only when encoded computer instructions are loaded into an electronic memory within a computer system and executed on a physical processor that so-called "software implemented" functionality is provided. The digitally encoded computer instructions are an essential and physical control component of processor-controlled machines and devices, no less essential and physical than a cam-shaft control system in an internal-combustion engine. Multi-cloud aggregations, cloud-computing services, virtual-machine containers and virtual machines, communications interfaces, and many of the other topics discussed below are tangible, physical components of physical, electro-optical-mechanical computer systems.

FIG. 1 shows a general architectural diagram for various types of computers. Computers that receive, process, and store event messages may be described by the general architectural diagram shown in FIG. 1, for example. The computer system contains one or multiple central processing units ("CPUs") 102-105, one or more electronic memories 108 interconnected with the CPUs by a CPU/memory-subsystem bus 110 or multiple busses, a first bridge 112 that interconnects the CPU/memory-subsystem bus 110 with additional busses 114 and 116, or other types of high-speed interconnection media, including multiple, high-speed serial interconnects. These busses or serial interconnections, in turn, connect the CPUs and memory with specialized processors, such as a graphics processor 118, and with one or more additional bridges 120, which are interconnected with high-speed serial links or with multiple controllers 122-127, such as controller 127, that provide access to various different types of mass-storage devices 128, electronic displays, input devices, and other such components, subcomponents, and computational devices. It should be noted that computer-readable data-storage devices include optical and electromagnetic disks, electronic memories, and other physical data-storage devices. Those familiar with modern science and technology appreciate that electromagnetic radiation and propagating signals do not store data for subsequent retrieval, and can transiently "store" only a byte or less of information per mile, far less information than needed to encode even the simplest of routines.

Of course, there are many different types of computer-system architectures that differ from one another in the number of different memories, including different types of hierarchical cache memories, the number of processors and the connectivity of the processors with other system components, the number of internal communications busses and serial links, and in many other ways. However, computer systems generally execute stored programs by fetching instructions from memory and executing the instructions in one or more processors. Computer systems include general-purpose computer systems, such as personal computers ("PCs"), various types of servers and workstations, and higher-end mainframe computers, but may also include a plethora of various types of special-purpose computing devices, including data-storage systems, communications routers, network nodes, tablet computers, and mobile telephones.

Figure 2:
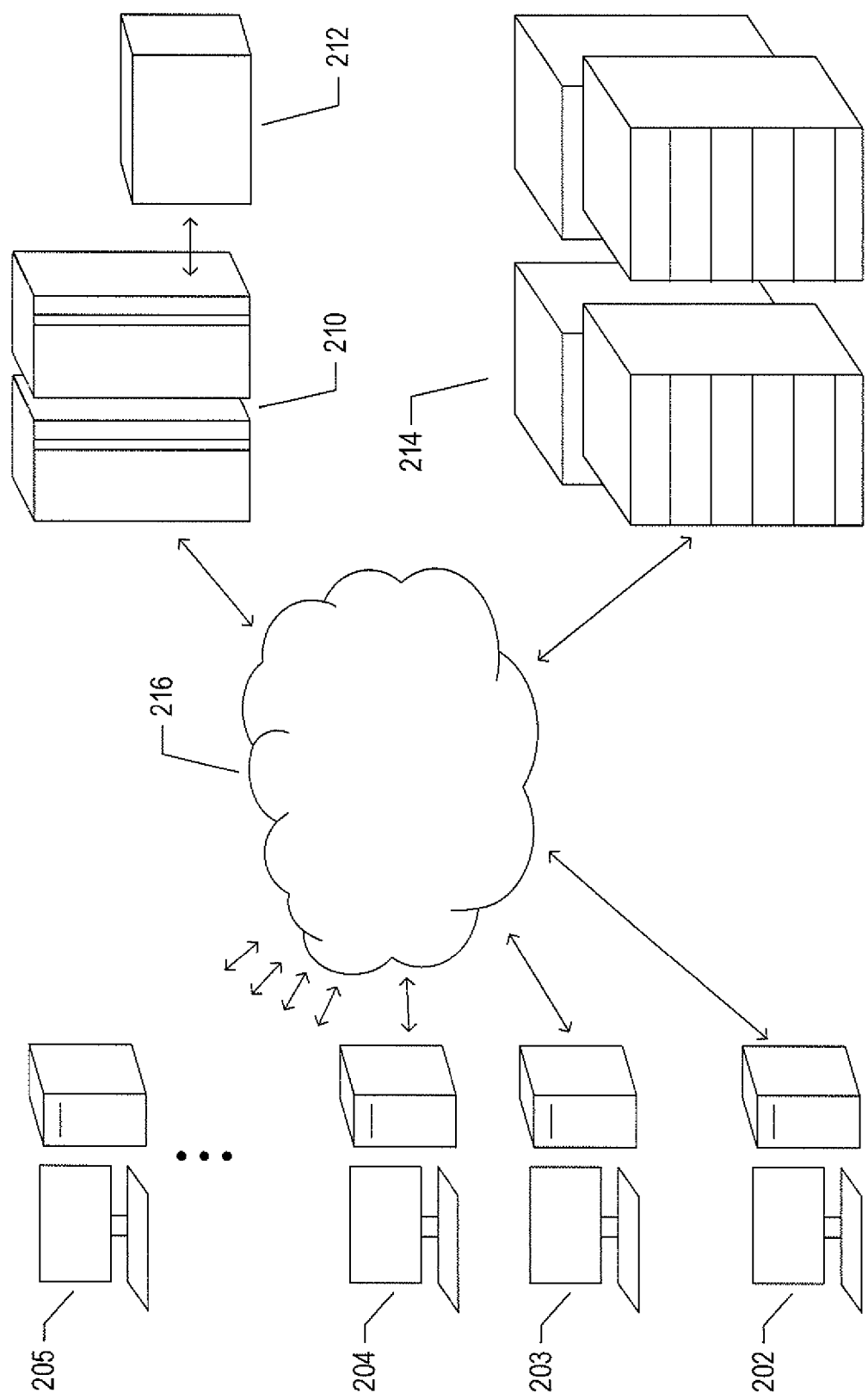
FIG. 2 shows an Internet-connected distributed computer system.

FIG. 2 shows an Internet-connected distributed computer system. As communications and networking technologies have evolved in capability and accessibility, and as the computational bandwidths, data-storage capacities, and other capabilities and capacities of various types of computer systems have steadily and rapidly increased, much of modern computing now generally involves large distributed systems and computers interconnected by local networks, wide-area networks, wireless communications, and the Internet. FIG. 2 shows a typical distributed system in which a large number of PCs 202-205, a high-end distributed mainframe system 210 with a large data-storage system 212, and a large computer center 214 with large numbers of rack-mounted servers or blade servers all interconnected through various communications and networking systems that together comprise the Internet 216. Such distributed computing systems provide diverse arrays of functionalities. For example, a PC user may access hundreds of millions of different web sites provided by hundreds of thousands of different web servers throughout the world and may access high-computational-bandwidth computing services from remote computer facilities for running complex computational tasks.

Until recently, computational services were generally provided by computer systems and data centers purchased, configured, managed, and maintained by service-provider organizations. For example, an e-commerce retailer generally purchased, configured, managed, and maintained a data center including numerous web servers, back-end computer systems, and data-storage systems for serving web pages to remote customers, receiving orders through the web-page interface, processing the orders, tracking completed orders, and other myriad different tasks associated with an e-commerce enterprise.

Figure 3:
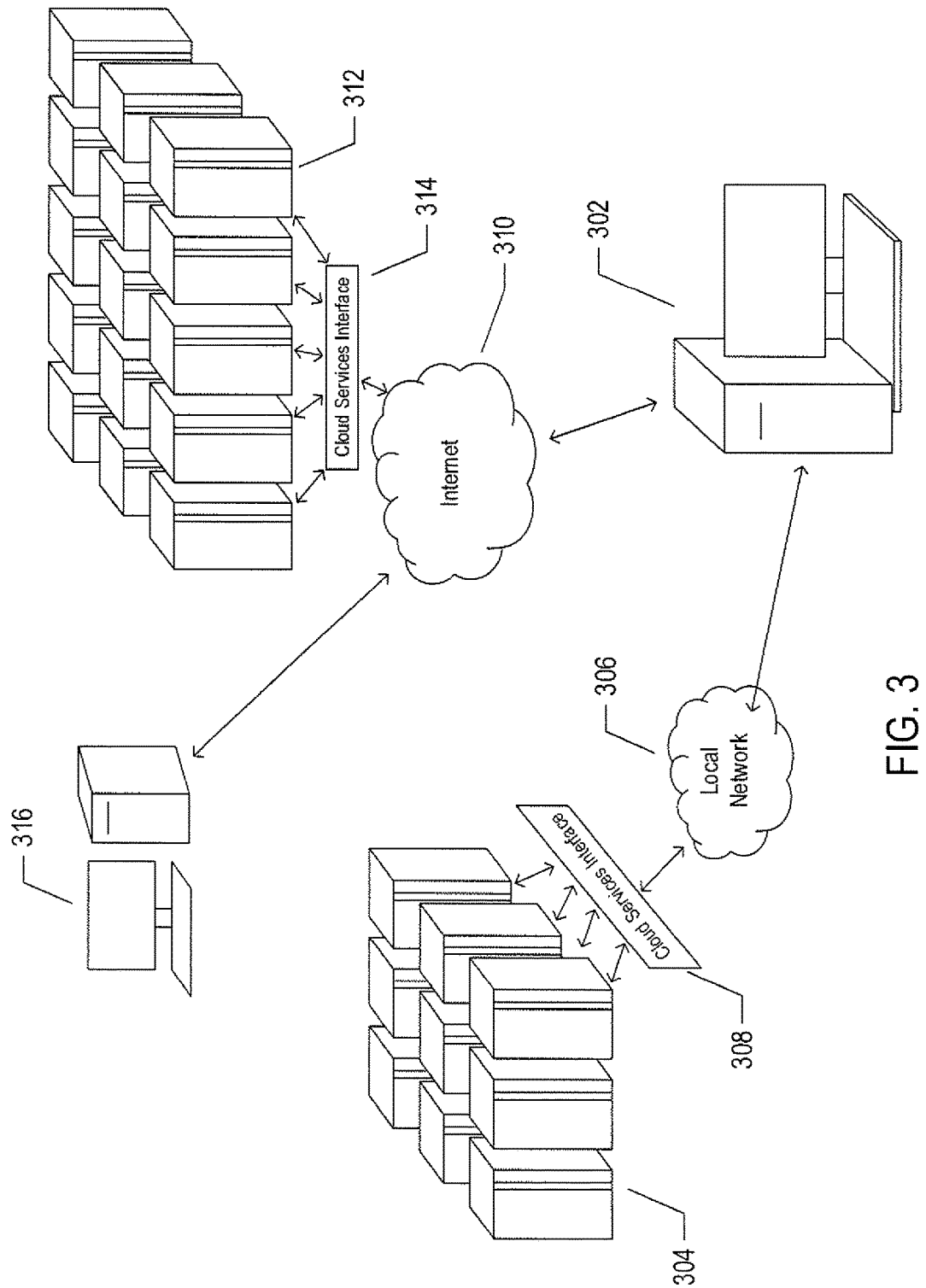
FIG. 3 shows cloud computing.

FIG. 3 shows cloud computing. In the recently developed cloud-computing paradigm, computing cycles and data-storage facilities are provided to organizations and individuals by cloud-computing providers. In addition, larger organizations may elect to establish private cloud-computing facilities in addition to, or instead of, subscribing to computing services provided by public cloud-computing service providers. In FIG. 3, a system administrator for an organization, using a PC 302, accesses the organization's private cloud 304 through a local network 306 and private-cloud interface 308 and also accesses, through the Internet 310, a public cloud 312 through a public-cloud services interface 314. The administrator can, in either the case of the private cloud 304 or public cloud 312, configure virtual computer systems and even entire virtual data centers and launch execution of application programs on the virtual computer systems and virtual data centers in order to carry out any of many different types of computational tasks. As one example, a small organization may configure and run a virtual data center within a public cloud that executes web servers to provide an e-commerce interface through the public cloud to remote customers of the organization, such as a user viewing the organization's e-commerce web pages on a remote user system 316.

Cloud-computing facilities are intended to provide computational bandwidth and data-storage services much as utility companies provide electrical power and water to consumers. Cloud computing provides enormous advantages to small organizations without the devices to purchase, manage, and maintain in-house data centers. Such organizations can dynamically add and delete virtual computer systems from their virtual data centers within public clouds in order to track computational-bandwidth and data-storage needs, rather than purchasing sufficient computer systems within a physical data center to handle peak computational-bandwidth and data-storage demands. Moreover, small organizations can completely avoid the overhead of maintaining and managing physical computer systems, including hiring and periodically retraining information-technology specialists and continuously paying for operating-system and database-management-system upgrades. Furthermore, cloud-computing interfaces allow for easy and straightforward configuration of virtual computing facilities, flexibility in the types of applications and operating systems that can be configured, and other functionalities that are useful even for owners and administrators of private cloud-computing facilities used by a single organization.

Figure 4:
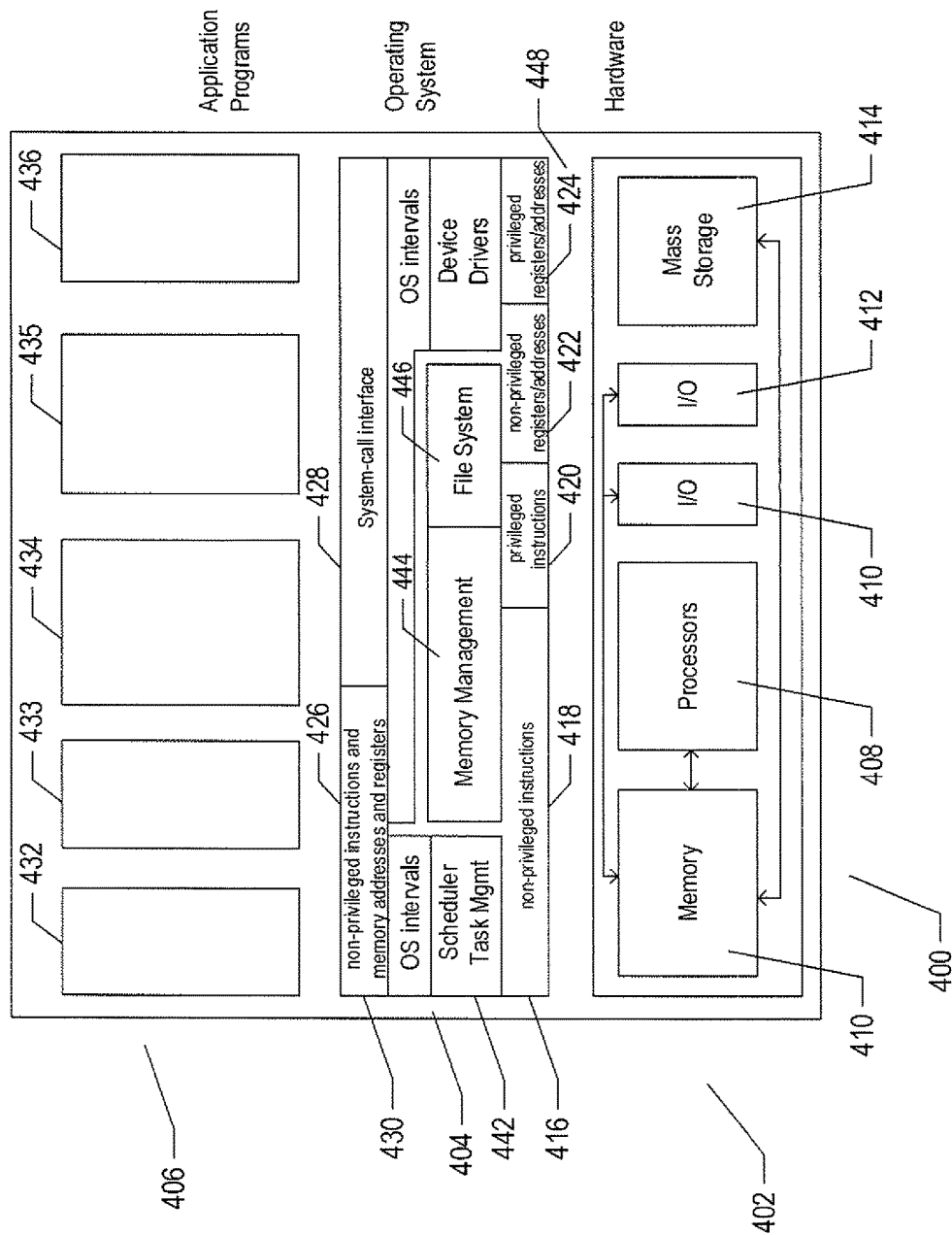
FIG. 4 shows generalized hardware and software components of a general-purpose computer system.

FIG. 4 shows generalized hardware and software components of a general-purpose computer system, such as a general-purpose computer system having an architecture similar to that shown in FIG. 1. The computer system 400 is often considered to include three fundamental layers: (1) a hardware layer or level 402; (2) an operating-system layer or level 404; and (3) an application-program layer or level 406. The hardware layer 402 includes one or more processors 408, system memory 410, various different types of input-output ("I/O") devices 410 and 412, and mass-storage devices 414. Of course, the hardware level also includes many other components, including power supplies, internal communications links and busses, specialized integrated circuits, many different types of processor-controlled or microprocessor-controlled peripheral devices and controllers, and many other components. The operating system 404 interfaces to the hardware level 402 through a low-level operating system and hardware interface 416 generally comprising a set of non-privileged computer instructions 418, a set of privileged computer instructions 420, a set of non-privileged registers and memory addresses 422, and a set of privileged registers and memory addresses 424. In general, the operating system exposes non-privileged instructions, non-privileged registers, and non-privileged memory addresses 426 and a system-call interface 428 as an operating-system interface 430 to application programs 432-436 that execute within an execution environment provided to the application programs by the operating system. The operating system, alone, accesses the privileged instructions, privileged registers, and privileged memory addresses. By reserving access to privileged instructions, privileged registers, and privileged memory addresses, the operating system can ensure that application programs and other higher-level computational entities cannot interfere with one another's execution and cannot change the overall state of the computer system in ways that could deleteriously impact system operation. The operating system includes many internal components and modules, including a scheduler 442, memory management 444, a file system 446, device drivers 448, and many other components and modules. To a certain degree, modern operating systems provide numerous levels of abstraction above the hardware level, including virtual memory, which provides to each application program and other computational entities a separate, large, linear memory-address space that is mapped by the operating system to various electronic memories and mass-storage devices. The scheduler orchestrates interleaved execution of various different application programs and higher-level computational entities, providing to each application program a virtual, stand-alone system devoted entirely to the application program. From the application program's standpoint, the application program executes continuously without concern for the need to share processor devices and other system devices with other application programs and higher-level computational entities. The device drivers abstract details of hardware-component operation, allowing application programs to employ the system-call interface for transmitting and receiving data to and from communications networks, mass-storage devices, and other I/O devices and subsystems. The file system 436 facilitates abstraction of mass-storage-device and memory devices as a high-level, easy-to-access, file-system interface. Thus, the development and evolution of the operating system has resulted in the generation of a type of multi-faceted virtual execution environment for application programs and other higher-level computational entities.

While the execution environments provided by operating systems have proved to be an enormously successful level of abstraction within computer systems, the operating-system-provided level of abstraction is nonetheless associated with difficulties and challenges for developers and users of application programs and other higher-level computational entities. One difficulty arises from the fact that there are many different operating systems that run within various different types of computer hardware. In many cases, popular application programs and computational systems are developed to run on only a subset of the available operating systems, and can therefore be executed within only a subset of the various different types of computer systems on which the operating systems are designed to run. Often, even when an application program or other computational system is ported to additional operating systems, the application program or other computational system can nonetheless run more efficiently on the operating systems for which the application program or other computational system was originally targeted. Another difficulty arises from the increasingly distributed nature of computer systems. Although distributed operating systems are the subject of considerable research and development efforts, many of the popular operating systems are designed primarily for execution on a single computer system. In many cases, it is difficult to move application programs, in real time, between the different computer systems of a distributed computer system for high-availability, fault-tolerance, and load-balancing purposes. The problems are even greater in heterogeneous distributed computer systems which include different types of hardware and devices running different types of operating systems. Operating systems continue to evolve, as a result of which certain older application programs and other computational entities may be incompatible with more recent versions of operating systems for which they are targeted, creating compatibility issues that are particularly difficult to manage in large distributed systems.

Figure 5A:
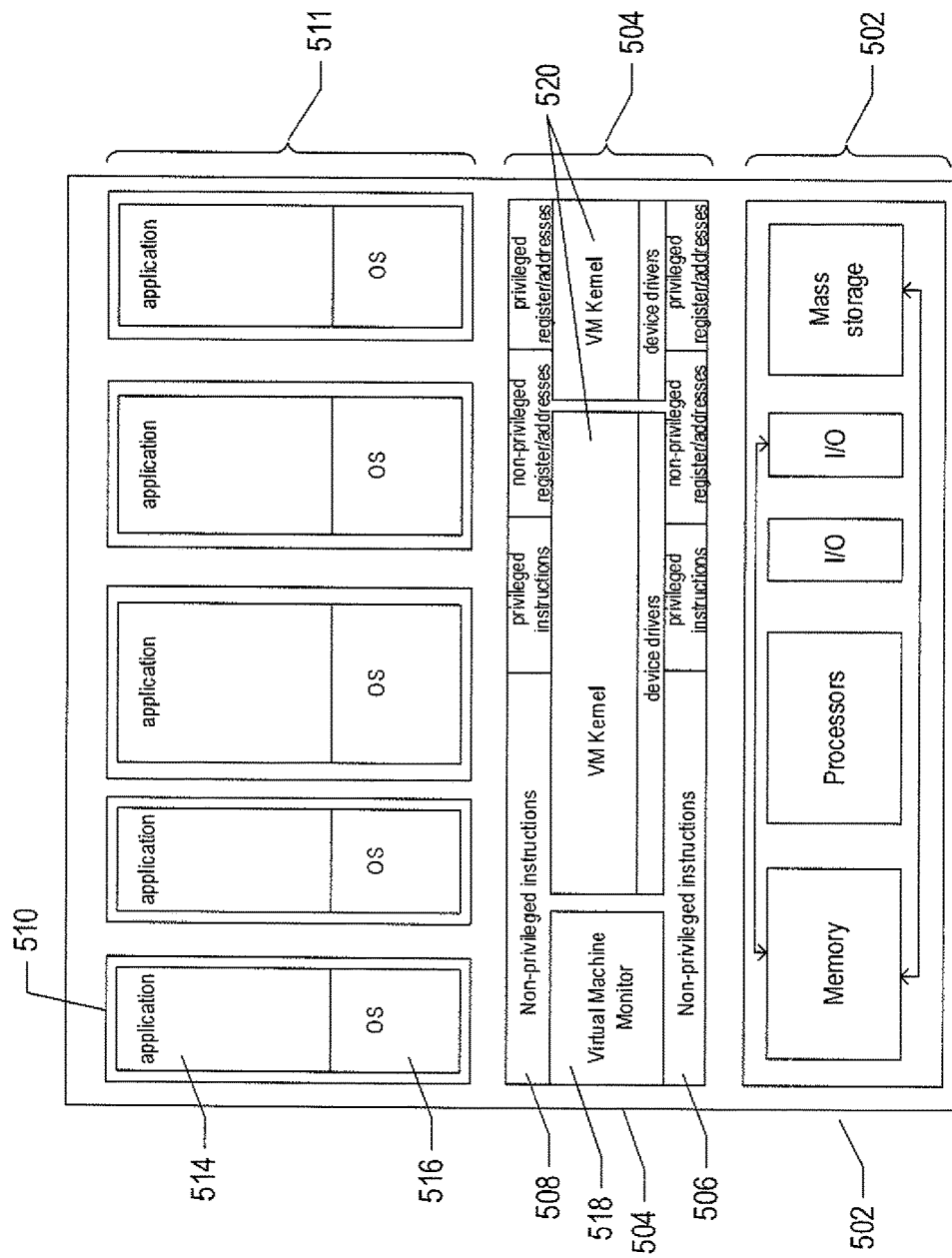
FIGS. 5A-5B show two types of virtual machine ("VM") and VM execution environments.
Figure 5B:
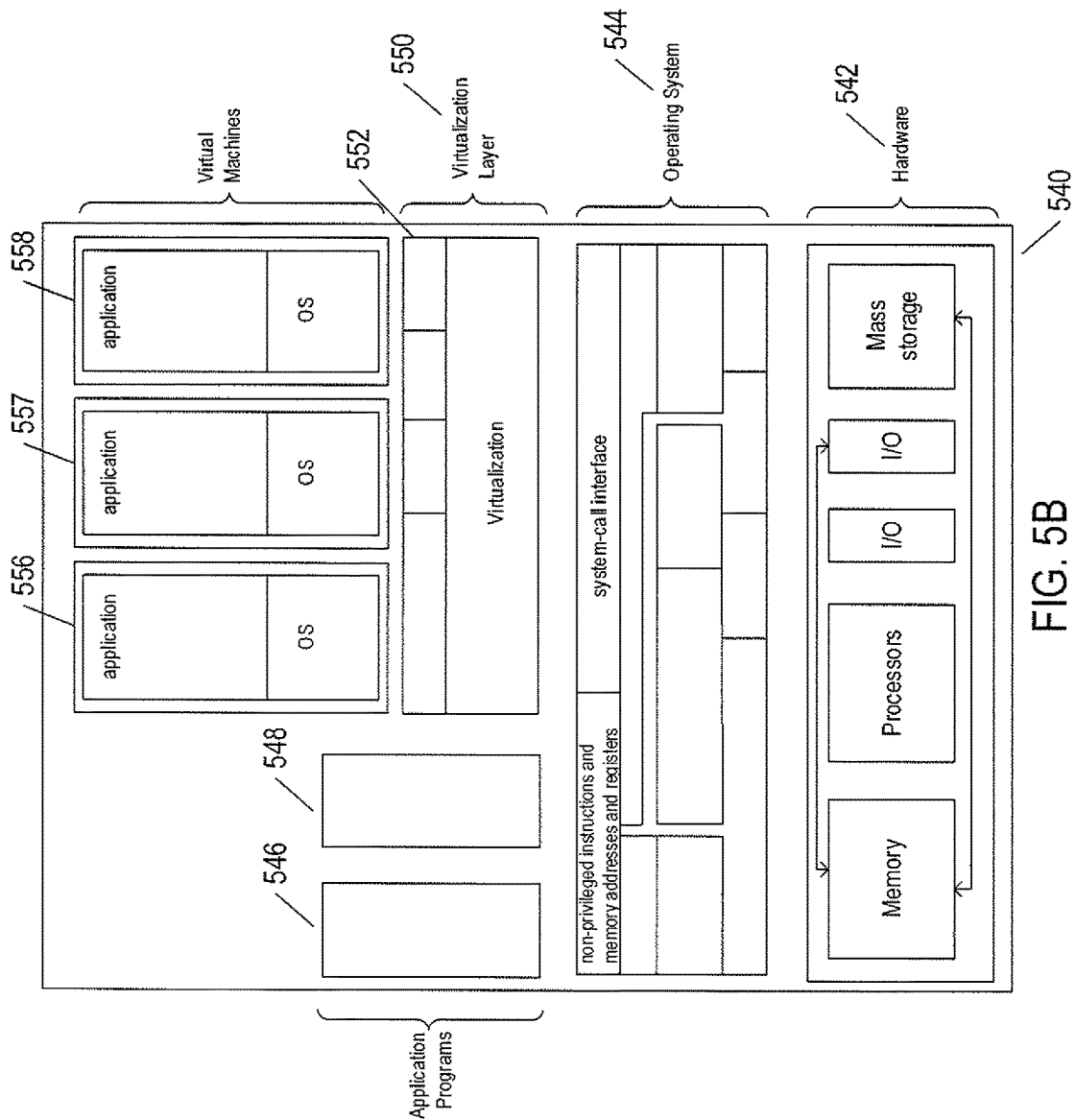

For all of these reasons, a higher level of abstraction, referred to as the "virtual machine," ("VM") has been developed and evolved to further abstract computer hardware in order to address many difficulties and challenges associated with traditional computing systems, including the compatibility issues discussed above. FIGS. 5A-B show two types of VM and virtual-machine execution environments. FIGS. 5A-B use the same illustration conventions as used in FIG. 4. FIG. 5A shows a first type of virtualization. The computer system 500 in FIG. 5A includes the same hardware layer 502 as the hardware layer 402 shown in FIG. 4. However, rather than providing an operating system layer directly above the hardware layer, as in FIG. 4, the virtualized computing environment shown in FIG. 5A features a virtualization layer 504 that interfaces through a virtualization-layer/hardware-layer interface 506, equivalent to interface 416 in FIG. 4, to the hardware. The virtualization layer 504 provides a hardware-like interface 508 to a number of VMs, such as VM 510, in a virtual-machine layer 511 executing above the virtualization layer 504. Each VM includes one or more application programs or other higher-level computational entities packaged together with an operating system, referred to as a "guest operating system," such as application 514 and guest operating system 516 packaged together within VM 510. Each VM is thus equivalent to the operating-system layer 404 and application-program layer 406 in the general-purpose computer system shown in FIG. 4. Each guest operating system within a VM interfaces to the virtualization-layer interface 508 rather than to the actual hardware interface 506. The virtualization layer 504 partitions hardware devices into abstract virtual-hardware layers to which each guest operating system within a VM interfaces. The guest operating systems within the VMs, in general, are unaware of the virtualization layer and operate as if they were directly accessing a true hardware interface. The virtualization layer 504 ensures that each of the VMs currently executing within the virtual environment receive a fair allocation of underlying hardware devices and that all VMs receive sufficient devices to progress in execution. The virtualization-layer interface 508 may differ for different guest operating systems. For example, the virtualization layer is generally able to provide virtual hardware interfaces for a variety of different types of computer hardware. This allows, as one example, a VM that includes a guest operating system designed for a particular computer architecture to run on hardware of a different architecture. The number of VMs need not be equal to the number of physical processors or even a multiple of the number of processors.

The virtualization layer 504 includes a virtual-machine-monitor module 518 ("VMM") that virtualizes physical processors in the hardware layer to create virtual processors on which each of the VMs executes. For execution efficiency, the virtualization layer attempts to allow VMs to directly execute non-privileged instructions and to directly access non-privileged registers and memory. However, when the guest operating system within a VM accesses virtual privileged instructions, virtual privileged registers, and virtual privileged memory through the virtualization-layer interface 508, the accesses result in execution of virtualization-layer code to simulate or emulate the privileged devices. The virtualization layer additionally includes a kernel module 520 that manages memory, communications, and data-storage machine devices on behalf of executing VMs ("VM kernel"). The VM kernel, for example, maintains shadow page tables on each VM so that hardware-level virtual-memory facilities can be used to process memory accesses. The VM kernel additionally includes routines that implement virtual communications and data-storage devices as well as device drivers that directly control the operation of underlying hardware communications and data-storage devices. Similarly, the VM kernel virtualizes various other types of I/O devices, including keyboards, optical-disk drives, and other such devices. The virtualization layer 504 essentially schedules execution of VMs much like an operating system schedules execution of application programs, so that the VMs each execute within a complete and fully functional virtual hardware layer.

FIG. 5B shows a second type of virtualization. In FIG. 5B, the computer system 540 includes the same hardware layer 542 and operating system layer 544 as the hardware layer 402 and the operating system layer 404 shown in FIG. 4. Several application programs 546 and 548 are shown running in the execution environment provided by the operating system 544. In addition, a virtualization layer 550 is also provided, in computer 540, but, unlike the virtualization layer 504 discussed with reference to FIG. 5A, virtualization layer 550 is layered above the operating system 544, referred to as the "host OS," and uses the operating system interface to access operating-system-provided functionality as well as the hardware. The virtualization layer 550 comprises primarily a VMM and a hardware-like interface 552, similar to hardware-like interface 508 in FIG. 5A. The virtualization-layer/hardware-layer interface 552, equivalent to interface 416 in FIG. 4, provides an execution environment for a number of VMs 556-558, each including one or more application programs or other higher-level computational entities packaged together with a guest operating system.

In FIGS. 5A-5B, the layers are somewhat simplified for clarity of illustration. For example, portions of the virtualization layer 550 may reside within the host-operating-system kernel, such as a specialized driver incorporated into the host operating system to facilitate hardware access by the virtualization layer.

It should be noted that virtual hardware layers, virtualization layers, and guest operating systems are all physical entities that are implemented by computer instructions stored in physical data-storage devices, including electronic memories, mass-storage devices, optical disks, magnetic disks, and other such devices. The term "virtual" does not, in any way, imply that virtual hardware layers, virtualization layers, and guest operating systems are abstract or intangible. Virtual hardware layers, virtualization layers, and guest operating systems execute on physical processors of physical computer systems and control operation of the physical computer systems, including operations that alter the physical states of physical devices, including electronic memories and mass-storage devices. They are as physical and tangible as any other component of a computer since, such as power supplies, controllers, processors, busses, and data-storage devices.

Figure 6:
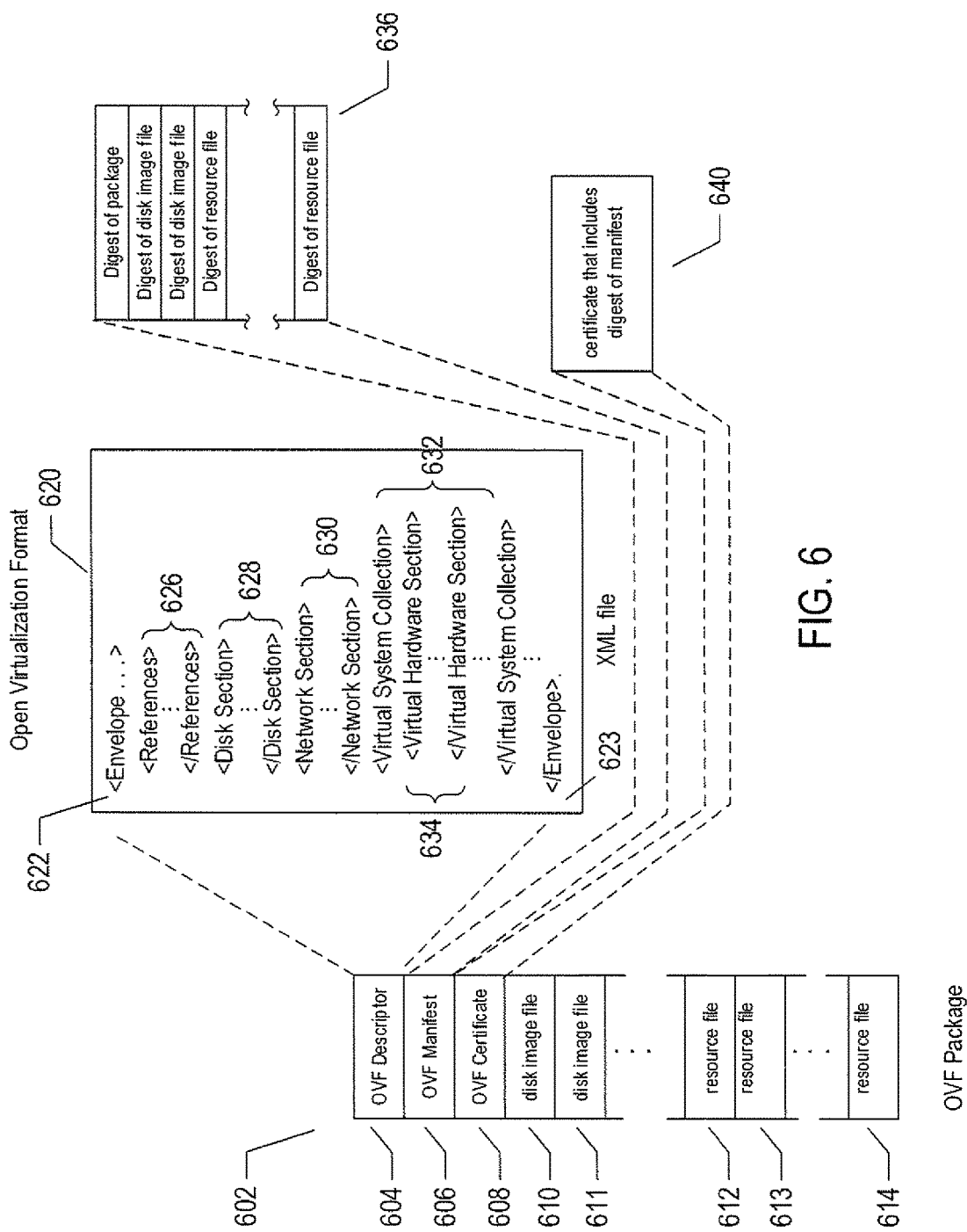
FIG. 6 shows an example of an open virtualization format package.

A VM or virtual application, described below, is encapsulated within a data package for transmission, distribution, and loading into a virtual-execution environment. One public standard for virtual-machine encapsulation is referred to as the "open virtualization format" ("OVF"). The OVF standard specifies a format for digitally encoding a VM within one or more data files. FIG. 6 shows an OVF package. An OVF package 602 includes an OVF descriptor 604, an OVF manifest 606, an OVF certificate 608, one or more disk-image files 610-611, and one or more device files 612-614. The OVF package can be encoded and stored as a single file or as a set of files. The OVF descriptor 604 is an XML document 620 that includes a hierarchical set of elements, each demarcated by a beginning tag and an ending tag. The outermost, or highest-level, element is the envelope element, demarcated by tags 622 and 623. The next-level element includes a reference element 626 that includes references to all files that are part of the OVF package, a disk section 628 that contains meta information about all of the virtual disks included in the OVF package, a networks section 630 that includes meta information about all of the logical networks included in the OVF package, and a collection of virtual-machine configurations 632 which further includes hardware descriptions of each VM 634. There are many additional hierarchical levels and elements within a typical OVF descriptor. The OVF descriptor is thus a self-describing, XML file that describes the contents of an OVF package. The OVF manifest 606 is a list of cryptographic-hash-function-generated digests 636 of the entire OVF package and of the various components of the OVF package. The OVF certificate 608 is an authentication certificate 640 that includes a digest of the manifest and that is cryptographically signed. Disk image files, such as disk image file 610, are digital encodings of the contents of virtual disks and device files 612 are digitally encoded content, such as operating-system images. A VM or a collection of VMs encapsulated together within a virtual application can thus be digitally encoded as one or more files within an OVF package that can be transmitted, distributed, and loaded using well-known tools for transmitting, distributing, and loading files. A virtual appliance is a software service that is delivered as a complete software stack installed within one or more VMs that is encoded within an OVF package.

The advent of VMs and virtual environments has alleviated many of the difficulties and challenges associated with traditional general-purpose computing. Machine and operating-system dependencies can be significantly reduced or entirely eliminated by packaging applications and operating systems together as VMs and virtual appliances that execute within virtual environments provided by virtualization layers running on many different types of computer hardware. A next level of abstraction, referred to as virtual data centers or virtual infrastructure, provide a data-center interface to virtual data centers computationally constructed within physical data centers.

Figure 7:
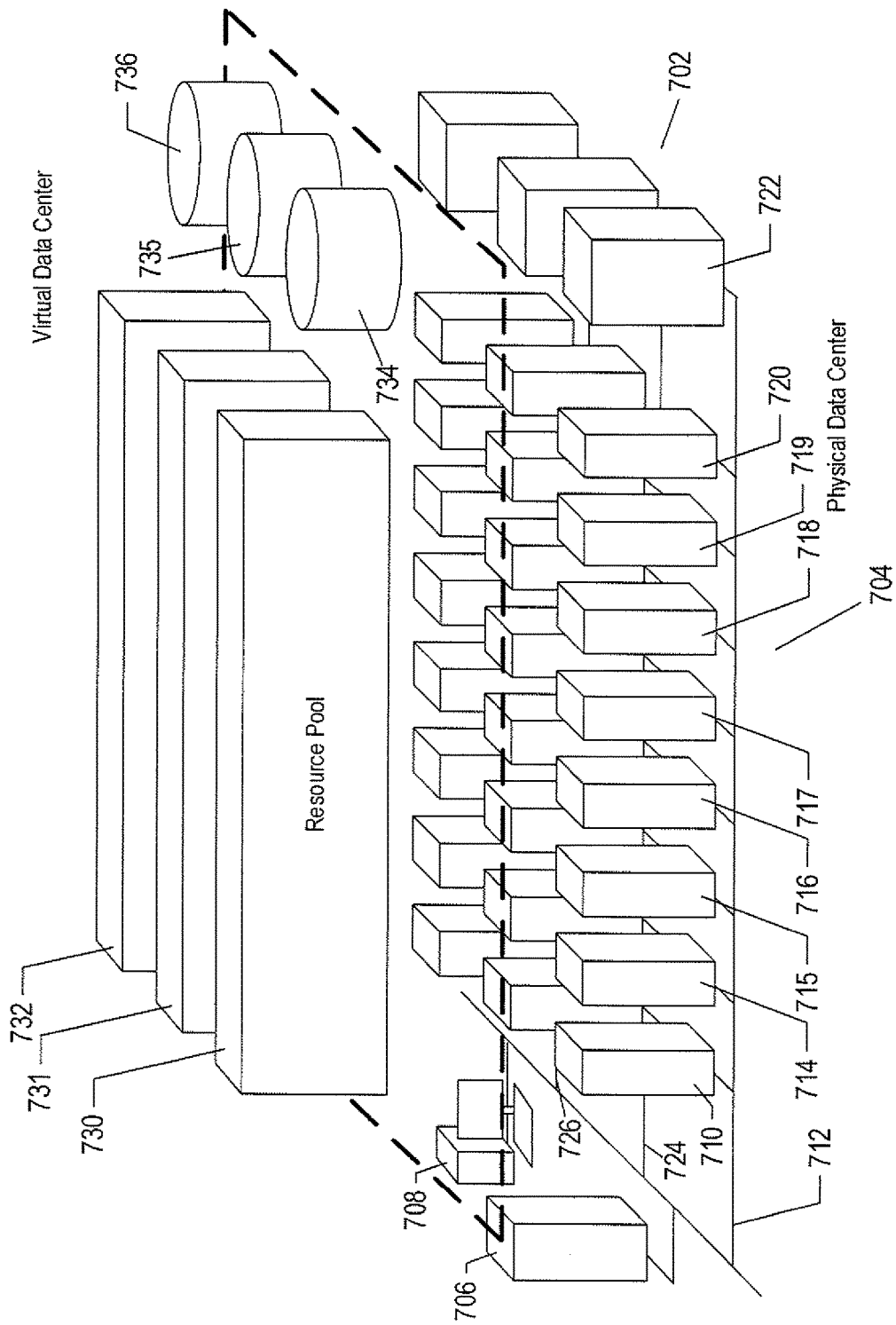
FIG. 7 shows virtual data centers provided as an abstraction of underlying physical-data-center hardware components.

FIG. 7 shows virtual data centers provided as an abstraction of underlying physical-data-center hardware components. In FIG. 7, a physical data center 702 is shown below a virtual-interface plane 704. The physical data center consists of a virtual-data-center management server 706 and any of various different computers, such as PCs 708, on which a virtual-data-center management interface may be displayed to system administrators and other users. The physical data center additionally includes generally large numbers of server computers, such as server computer 710, that are coupled together by local area networks, such as local area network 712 that directly interconnects server computer 710 and 714-720 and a mass-storage array 722. The physical data center shown in FIG. 7 includes three local area networks 712, 724, and 726 that each directly interconnects a bank of eight servers and a mass-storage array. The individual server computers, such as server computer 710, each includes a virtualization layer and runs multiple VMs. Different physical data centers may include many different types of computers, networks, data-storage systems and devices connected according to many different types of connection topologies. The virtual-interface plane 704, a logical abstraction layer shown by a plane in FIG. 7, abstracts the physical data center to a virtual data center comprising one or more device pools, such as device pools 730-732, one or more virtual data stores, such as virtual data stores 734-736, and one or more virtual networks. In certain implementations, the device pools abstract banks of physical servers directly interconnected by a local area network.

The virtual-data-center management interface allows provisioning and launching of VMs with respect to device pools, virtual data stores, and virtual networks, so that virtual-data-center administrators need not be concerned with the identities of physical-data-center components used to execute particular VMs. Furthermore, the virtual-data-center management server 706 includes functionality to migrate running VMs from one physical server to another in order to optimally or near optimally manage device allocation, provide fault tolerance, and high availability by migrating VMs to most effectively utilize underlying physical hardware devices, to replace VMs disabled by physical hardware problems and failures, and to ensure that multiple VMs supporting a high-availability virtual appliance are executing on multiple physical computer systems so that the services provided by the virtual appliance are continuously accessible, even when one of the multiple virtual appliances becomes compute bound, data-access bound, suspends execution, or fails. Thus, the virtual data center layer of abstraction provides a virtual-data-center abstraction of physical data centers to simplify provisioning, launching, and maintenance of VMs and virtual appliances as well as to provide high-level, distributed functionalities that involve pooling the devices of individual physical servers and migrating VMs among physical servers to achieve load balancing, fault tolerance, and high availability.

Figure 8:
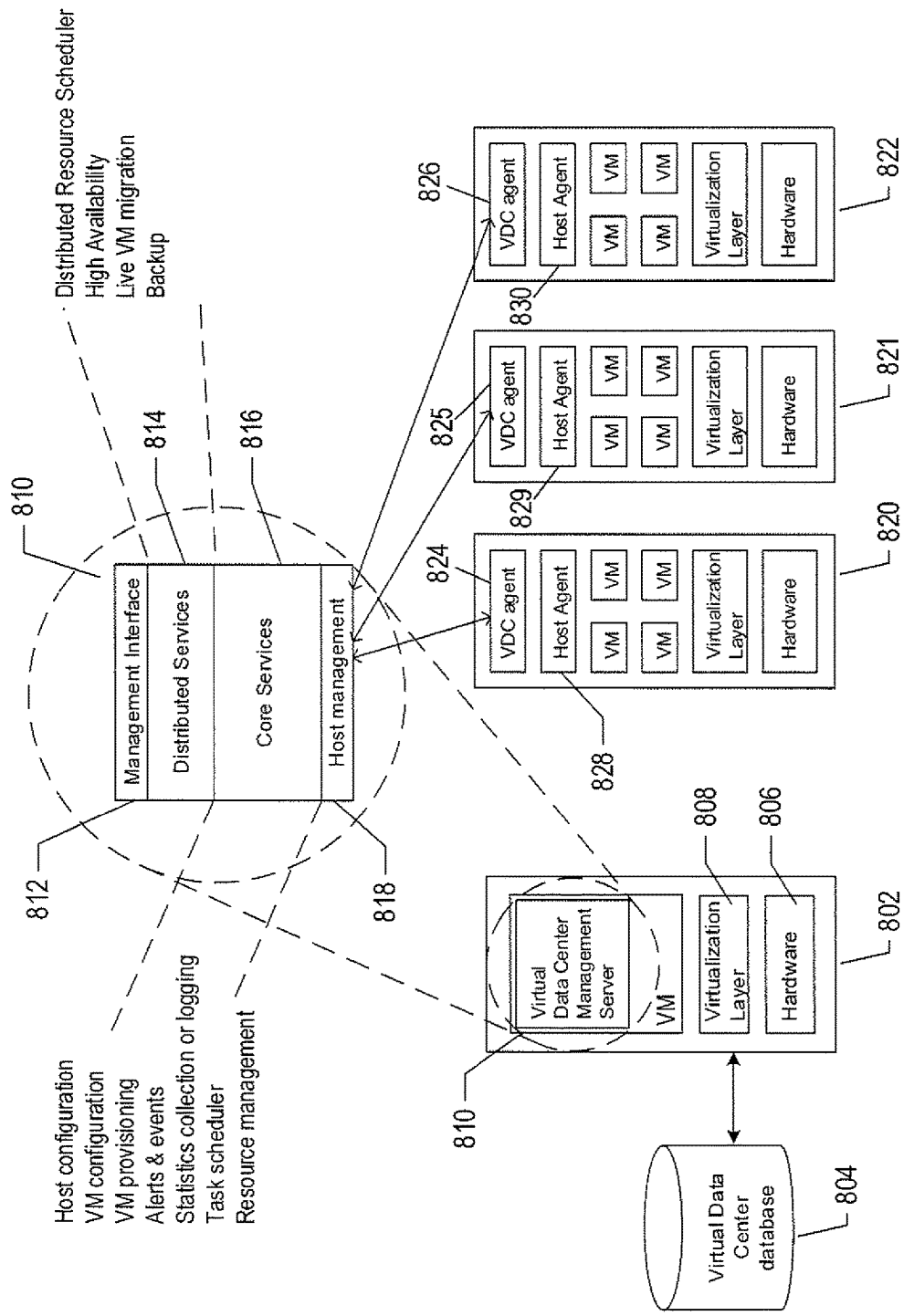
FIG. 8 shows virtual-machine components of a virtual-data-center management server and physical servers of a physical data center.

FIG. 8 shows virtual-machine components of a virtual-data-center management server and physical servers of a physical data center above which a virtual-data-center interface is provided by the virtual-data-center management server. The virtual-data-center management server 802 and a virtual-data-center database 804 comprise the physical components of the management component of the virtual data center. The virtual-data-center management server 802 includes a hardware layer 806 and virtualization layer 808, and runs a virtual-data-center management-server VM 810 above the virtualization layer. Although shown as a single server in FIG. 8, the virtual-data-center management server ("VDC management server") may include two or more physical server computers that support multiple VDC-management-server virtual appliances. The VM 810 includes a management-interface component 812, distributed services 814, core services 816, and a host-management interface 818. The management interface 818 is accessed from any of various computers, such as the PC 708 shown in FIG. 7. The management interface 818 allows the virtual-data-center administrator to configure a virtual data center, provision VMs, collect statistics and view log files for the virtual data center, and to carry out other, similar management tasks. The host-management interface 818 interfaces to virtual-data-center agents 824, 825, and 826 that execute as VMs within each of the physical servers of the physical data center that is abstracted to a virtual data center by the VDC management server.

The distributed services 814 include a distributed-device scheduler that assigns VMs to execute within particular physical servers and that migrates VMs in order to most effectively make use of computational bandwidths, data-storage capacities, and network capacities of the physical data center. The distributed services 814 further include a high-availability service that replicates and migrates VMs in order to ensure that VMs continue to execute despite problems and failures experienced by physical hardware components. The distributed services 814 also include a live-virtual-machine migration service that temporarily halts execution of a VM, encapsulates the VM in an OVF package, transmits the OVF package to a different physical server, and restarts the VM on the different physical server from a virtual-machine state recorded when execution of the VM was halted. The distributed services 814 also include a distributed backup service that provides centralized virtual-machine backup and restore.

The core services 816 provided by the VDC management server 810 include host configuration, virtual-machine configuration, virtual-machine provisioning, generation of virtual-data-center alarms and events, ongoing event logging and statistics collection, a task scheduler, and a device-management module. Each physical server 820-822 also includes a host-agent VM 828-830 through which the virtualization layer can be accessed via a virtual-infrastructure application programming interface ("API"). This interface allows a remote administrator or user to manage an individual server through the infrastructure API. The virtual-data-center agents 824-826 access virtualization-layer server information through the host agents. The virtual-data-center agents are primarily responsible for offloading certain of the virtual-data-center management-server functions specific to a particular physical server to that physical server. The virtual-data-center agents relay and enforce device allocations made by the VDC management server 810, relay virtual-machine provisioning and configuration-change commands to host agents, monitor and collect performance statistics, alarms, and events communicated to the virtual-data-center agents by the local host agents through the interface API, and to carry out other, similar virtual-data-management tasks.

The virtual-data-center abstraction provides a convenient and efficient level of abstraction for exposing the computational devices of a cloud-computing facility to cloud-computing-infrastructure users. A cloud-director management server exposes virtual devices of a cloud-computing facility to cloud-computing-infrastructure users. In addition, the cloud director introduces a multi-tenancy layer of abstraction, which partitions VDCs into tenant-associated VDCs that can each be allocated to a particular individual tenant or tenant organization, both referred to as a "tenant." A given tenant can be provided one or more tenant-associated VDCs by a cloud director managing the multi-tenancy layer of abstraction within a cloud-computing facility. The cloud services interface (308 in FIG. 3) exposes a virtual-data-center management interface that abstracts the physical data center.

Figure 9:
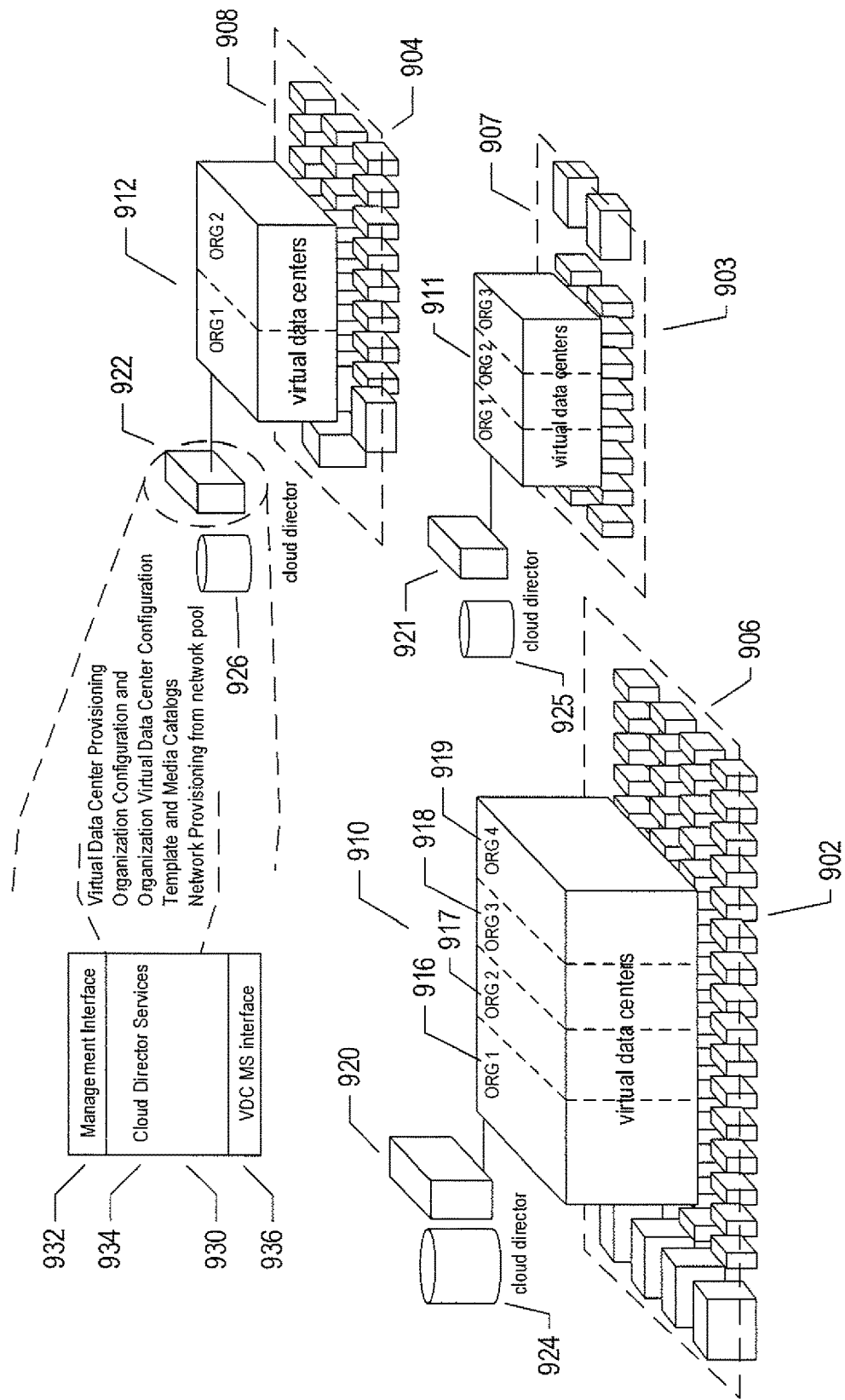
FIG. 9 shows a cloud-director level of abstraction.

FIG. 9 shows a cloud-director level of abstraction. In FIG. 9, three different physical data centers 902-904 are shown below planes representing the cloud-director layer of abstraction 906-908. Above the planes representing the cloud-director level of abstraction, multi-tenant virtual data centers 910-912 are shown. The devices of these multi-tenant virtual data centers are securely partitioned in order to provide secure virtual data centers to multiple tenants, or cloud-services-accessing organizations. For example, a cloud-services-provider virtual data center 910 is partitioned into four different tenant-associated virtual-data centers within a multi-tenant virtual data center for four different tenants 916-919. Each multi-tenant virtual data center is managed by a cloud director comprising one or more cloud-director servers 920-922 and associated cloud-director databases 924-926. Each cloud-director server or servers runs a cloud-director virtual appliance 930 that includes a cloud-director management interface 932, a set of cloud-director services 934, and a virtual-data-center management-server interface 936. The cloud-director services include an interface and tools for provisioning multi-tenant virtual data center virtual data centers on behalf of tenants, tools and interfaces for configuring and managing tenant organizations, tools and services for organization of virtual data centers and tenant-associated virtual data centers within the multi-tenant virtual data center, services associated with template and media catalogs, and provisioning of virtualization networks from a network pool. Templates are VMs that each contains an OS and/or one or more VMs containing applications. A template may include much of the detailed contents of VMs and virtual appliances that are encoded within OVF packages, so that the task of configuring a VM or virtual appliance is significantly simplified, requiring only deployment of one OVF package. These templates are stored in catalogs within a tenant's virtual-data center. These catalogs are used for developing and staging new virtual appliances and published catalogs are used for sharing templates in virtual appliances across organizations. Catalogs may include OS images and other information relevant to construction, distribution, and provisioning of virtual appliances.

Considering FIGS. 7 and 9, the VDC-server and cloud-director layers of abstraction can be seen, as discussed above, to facilitate employment of the virtual-data-center concept within private and public clouds. However, this level of abstraction does not fully facilitate aggregation of single-tenant and multi-tenant virtual data centers into heterogeneous or homogeneous aggregations of cloud-computing facilities.

Figure 10:
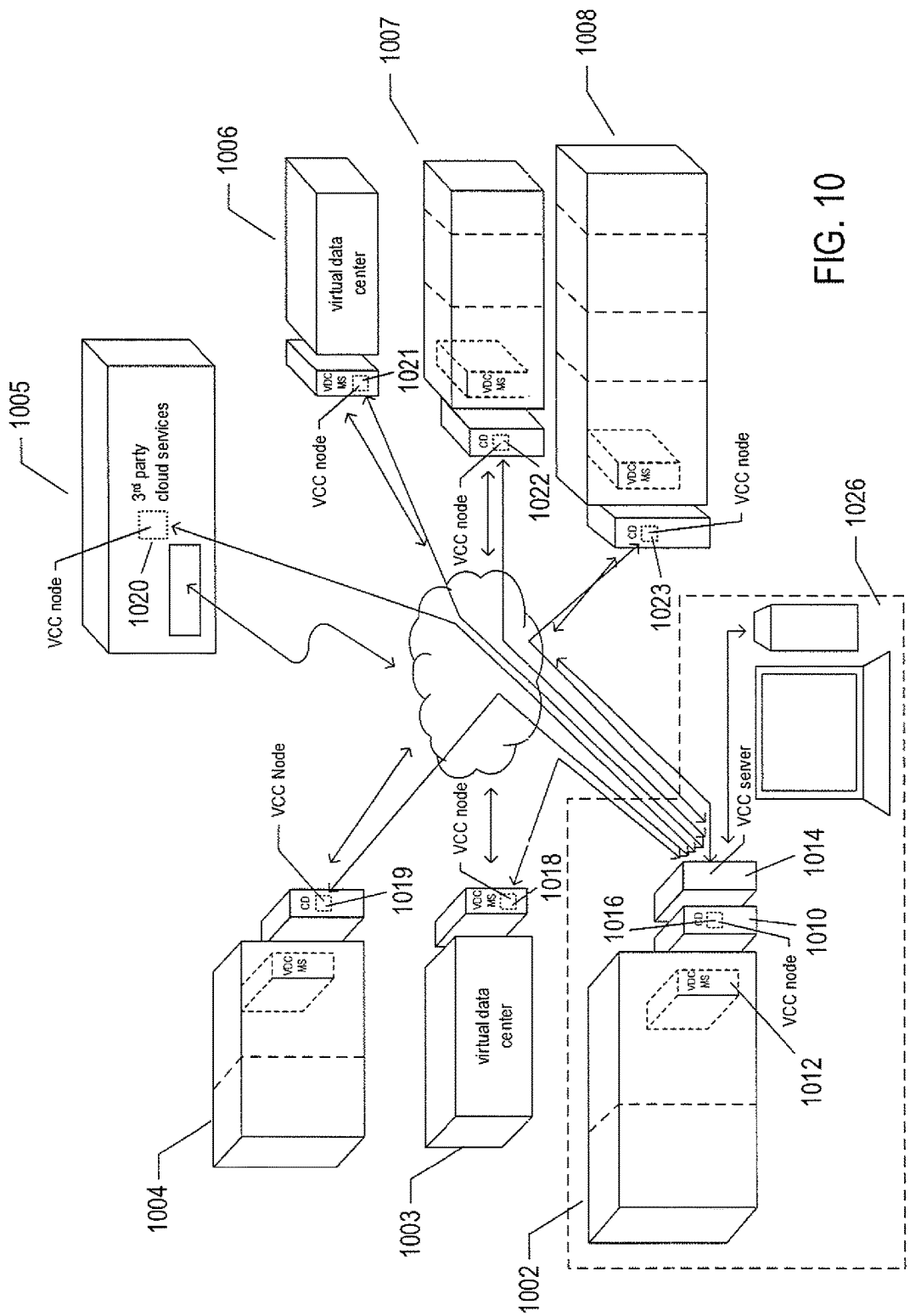
FIG. 10 shows virtual-cloud-connector nodes.

FIG. 10 shows virtual-cloud-connector nodes ("VCC nodes") and a VCC server, components of a distributed system that provides multi-cloud aggregation and that includes a cloud-connector server and cloud-connector nodes that cooperate to provide services that are distributed across multiple clouds. VMware vCloud™ VCC servers and nodes are one example of VCC server and nodes. In FIG. 10, seven different cloud-computing facilities are shown 1002-1008. Cloud-computing facility 1002 is a private multi-tenant cloud with a cloud director 1010 that interfaces to a VDC management server 1012 to provide a multi-tenant private cloud comprising multiple tenant-associated virtual data centers. The remaining cloud-computing facilities 1003-1008 may be either public or private cloud-computing facilities and may be single-tenant virtual data centers, such as virtual data centers 1003 and 1006, multi-tenant virtual data centers, such as multi-tenant virtual data centers 1004 and 1007-1008, or any of various different kinds of third-party cloud-services facilities, such as third-party cloud-services facility 1005. An additional component, the VCC server 1014, acting as a controller is included in the private cloud-computing facility 1002 and interfaces to a VCC node 1016 that runs as a virtual appliance within the cloud director 1010. A VCC server may also run as a virtual appliance within a VDC management server that manages a single-tenant private cloud. The VCC server 1014 additionally interfaces, through the Internet, to VCC node virtual appliances executing within remote VDC management servers, remote cloud directors, or within the third-party cloud services 1018-1023. The VCC server provides a VCC server interface that can be displayed on a local or remote terminal, PC, or other computer system 1026 to allow a cloud-aggregation administrator or other user to access VCC-server-provided aggregate-cloud distributed services. In general, the cloud-computing facilities that together form a multiple-cloud-computing aggregation through distributed services provided by the VCC server and VCC nodes are geographically and operationally distinct.

Containers and Containers Supported by Virtualization Layers

As mentioned above, while the virtual-machine-based virtualization layers, described in the previous subsection, have received widespread adoption and use in a variety of different environments, from personal computers to enormous distributed computing systems, traditional virtualization technologies are associated with computational overheads. While these computational overheads have steadily decreased, over the years, and often represent ten percent or less of the total computational bandwidth consumed by an application running above a guest operating system in a virtualized environment, traditional virtualization technologies nonetheless involve computational costs in return for the power and flexibility that they provide.

While a traditional virtualization layer can simulate the hardware interface expected by any of many different operating systems, OSL virtualization essentially provides a secure partition of the execution environment provided by a particular operating system. As one example, OSL virtualization provides a file system to each container, but the file system provided to the container is essentially a view of a partition of the general file system provided by the underlying operating system of the host. In essence, OSL virtualization uses operating-system features, such as namespace isolation, to isolate each container from the other containers running on the same host. In other words, namespace isolation ensures that each application is executed within the execution environment provided by a container to be isolated from applications executing within the execution environments provided by the other containers. A container cannot access files not included the container's namespace and cannot interact with applications running in other containers. As a result, a container can be booted up much faster than a VM, because the container uses operating-system-kernel features that are already available and functioning within the host. Furthermore, the containers share computational bandwidth, memory, network bandwidth, and other computational resources provided by the operating system, without the overhead associated with computational resources allocated to VMs and virtualization layers. Again, however, OSL virtualization does not provide many desirable features of traditional virtualization. As mentioned above, OSL virtualization does not provide a way to run different types of operating systems for different groups of containers within the same host and OSL-virtualization does not provide for live migration of containers between hosts, high-availability functionality, distributed resource scheduling, and other computational functionality provided by traditional virtualization technologies.

Figure 11:
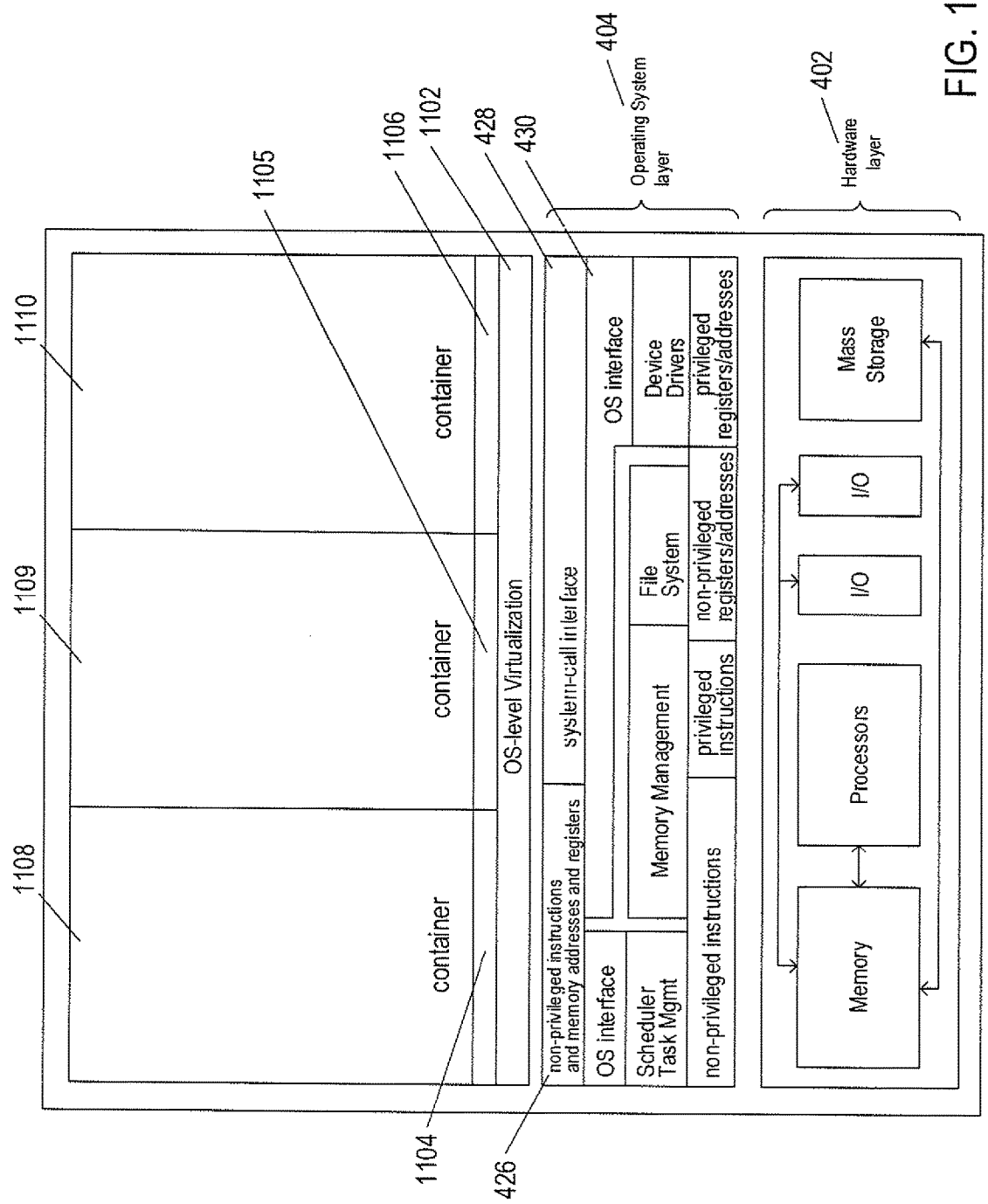
FIG. 11 shows an example server computer used to host three containers.

FIG. 11 shows an example server computer used to host three containers. As discussed above with reference to FIG. 4, an operating system layer 404 runs above the hardware 402 of the host computer. The operating system provides an interface, for higher-level computational entities, that includes a system-call interface 428 and the non-privileged instructions, memory addresses, and registers 426 provided by the hardware layer 402. However, unlike in FIG. 4, in which applications run directly above the operating system layer 404, OSL virtualization involves an OSL virtualization layer 1102 that provides operating-system interfaces 1104-1106 to each of the containers 1108-1110. The containers, in turn, provide an execution environment for an application that runs within the execution environment provided by container 1108. The container can be thought of as a partition of the resources generally available to higher-level computational entities through the operating system interface 430.

Figure 12:
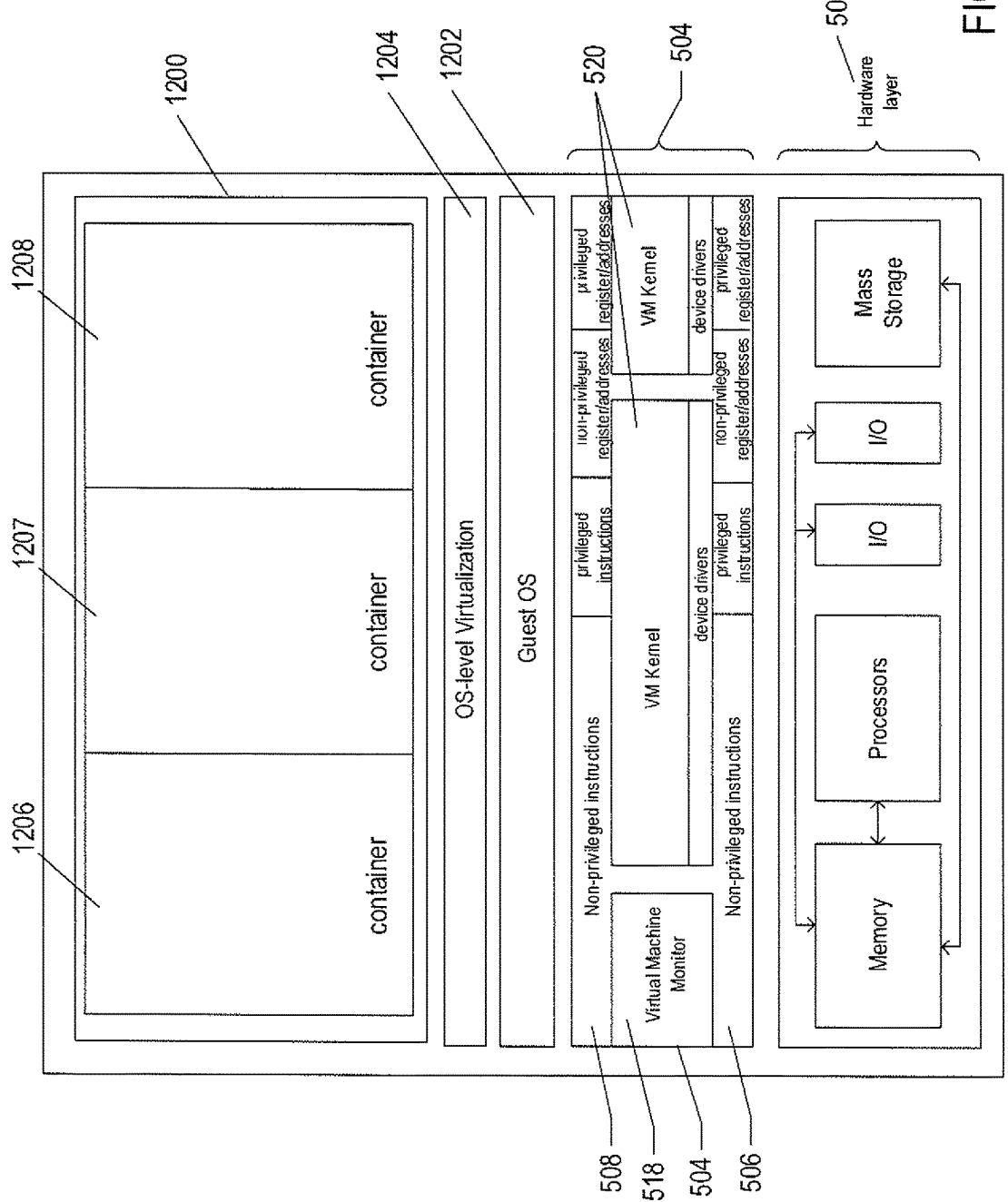
FIG. 12 shows an approach to implementing the containers on a VM.

FIG. 12 shows an approach to implementing the containers on a VM. FIG. 12 shows a host computer similar to that shown in FIG. 5A, discussed above. The host computer includes a hardware layer 502 and a virtualization layer 504 that provides a virtual hardware interface 508 to a guest operating system 1102. Unlike in FIG. 5A, the guest operating system interfaces to an OSL-virtualization layer 1104 that provides container execution environments 1206-1208 to multiple application programs.

Note that, although only a single guest operating system and OSL virtualization layer are shown in FIG. 12, a single virtualized host system can run multiple different guest operating systems within multiple VMs, each of which supports one or more OSL-virtualization containers. A virtualized, distributed computing system that uses guest operating systems running within VMs to support OSL-virtualization layers to provide containers for running applications is referred to, in the following discussion, as a "hybrid virtualized distributed computing system."

Running containers above a guest operating system within a VM provides advantages of traditional virtualization in addition to the advantages of OSL virtualization. Containers can be quickly booted in order to provide additional execution environments and associated resources for additional application instances. The resources available to the guest operating system are efficiently partitioned among the containers provided by the OSL-virtualization layer 1204 in FIG. 12, because there is almost no additional computational overhead associated with container-based partitioning of computational resources. However, many of the powerful and flexible features of the traditional virtualization technology can be applied to VMs in which containers run above guest operating systems, including live migration from one host to another, various types of high-availability and distributed resource scheduling, and other such features. Containers provide share-based allocation of computational resources to groups of applications with guaranteed isolation of applications in one container from applications in the remaining containers executing above a guest operating system. Moreover, resource allocation can be modified at run time between containers. The traditional virtualization layer provides for flexible and scaling over large numbers of hosts within large distributed computing systems and a simple approach to operating-system upgrades and patches. Thus, the use of OSL virtualization above traditional virtualization in a hybrid virtualized distributed computing system, as shown in FIG. 12, provides many of the advantages of both a traditional virtualization layer and the advantages of OSL virtualization.

Methods to Reduce Time Series Data and Detect Outliers

Figure 13:
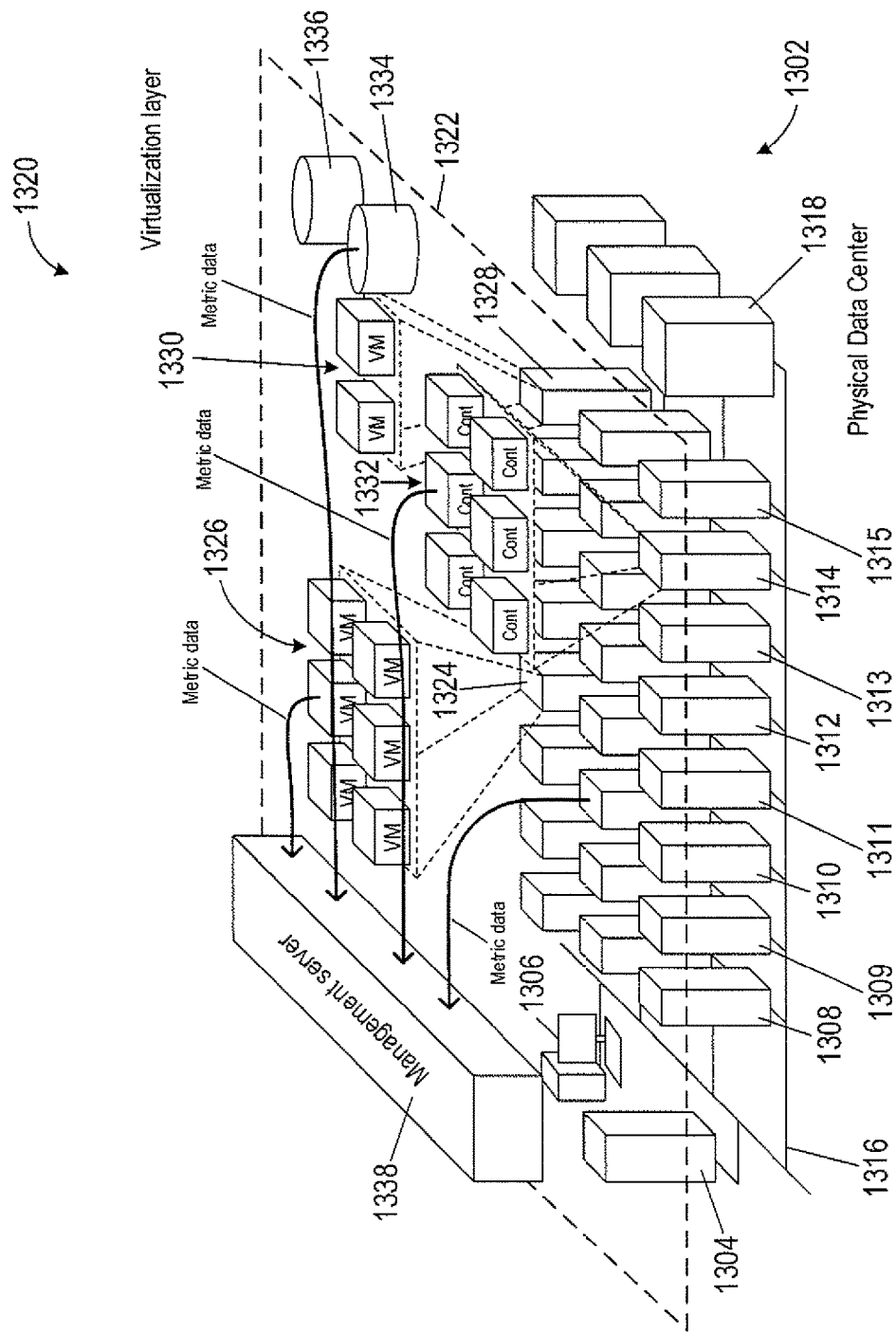
FIG. 13 shows example sources of time series data in a physical data center.

FIG. 13 shows example sources of time series data in a physical data center. The physical data center 1302 comprises a management server computer 1304 and any of various computers, such as PC 1306, on which a virtual-data-center management interface may be displayed to system administrators and other users. The physical data center 1302 additionally includes server computers, such as server computers 1308-1315, that are coupled together by local area networks, such as local area network 1316 that directly interconnects server computers 1308-1315 and a mass-storage array 1318. The physical data center 1302 includes three local area networks that each directly interconnects a bank of eight server computers and a mass-storage array. Different physical data centers may include many different types of computers, networks, data-storage systems and devices connected according to many different types of connection topologies. A virtual-interface plane 1322 separates a virtualization layer 1320 from the physical data center 1804. The virtualization layer 1320 includes virtual objects, such as VMs and containers, hosted by the server computers in the physical data center 1302. Certain server computers host VMs as described above with reference to FIGS. 5A-5B. For example, server computer 1324 is a host for six VMs 1326 and server computer 1328 is a host for two VMs 1330. Other server computers may host containers as described above with reference to FIGS. 11 and 12. For example, server computer 1314 is a host for six containers 1832. The virtual-interface plane 1322 abstracts the physical data center 1302 to one or more VDCs comprising the virtual objects and one or more virtual data stores, such as virtual data stores 1334 and 1336, and one or more virtual networks. For example, one VDC may comprise VMs 1326 and virtual data store 1334 and another VDC may comprise VMs 1330 and virtual data store 1336.

FIG. 13 also shows a management server 1338 located in the virtualization layer 1320 and hosted by the management server computer 1304. The management server 1338 receives and stores time series data generated by various physical and virtual resources. The physical resources include processors, memory, network connections, and storage of each computer system, mass-storage devices, and other physical components of the physical data center 1804. Virtual resources also include virtual processors, memory, network connections and storage of the virtualization layer 1320. The management server 1338 monitors physical and virtual resources by collecting time series data from the physical and virtual objects. Time series data includes physical and virtual CPU usage, amount of memory, network throughput, network traffic, and amount of storage. CPU usage is a measure of CPU time used to process instructions of an application program or operating system as a percentage of CPU capacity. High CPU usage may be an indication of usually large demand for processing power, such as when an application program enters an infinite loop. Amount of memory is the amount of memory (e.g., GBs) an object uses at a given time. Because time series data is collected with such high frequency, the data sets are extremely large and occupy large volumes of storage space within the physical data center 1302. In addition, because the data sets are large and each data set alone comprises a large amount of time series data points, the management server 1338 is typically overloaded and unable to timely detect anomalies, problems, and characterize each time series data set.

Figure 14:
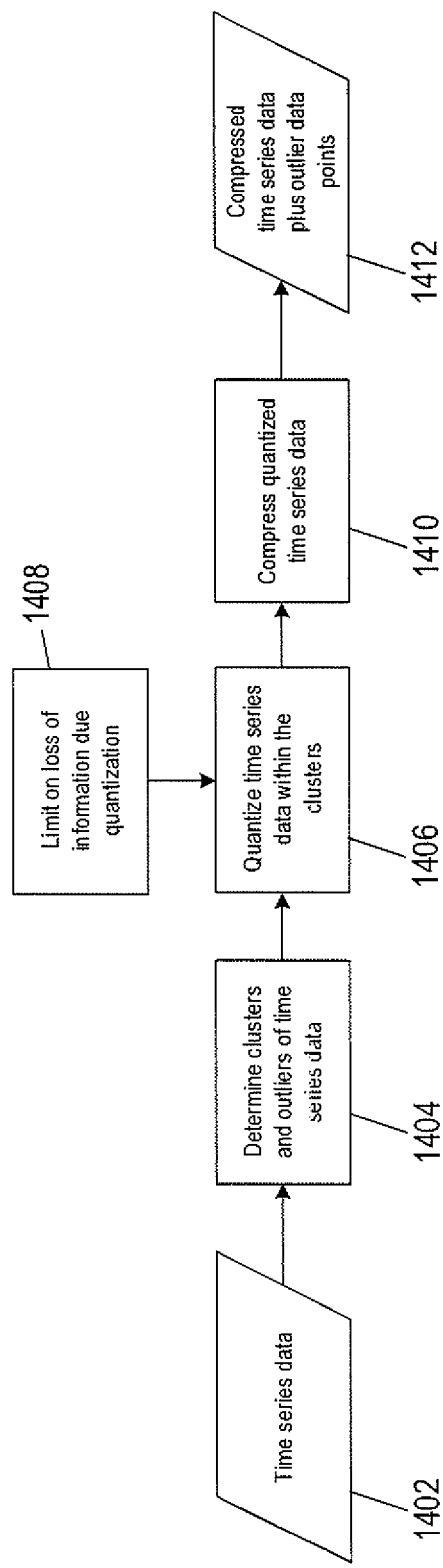
FIG. 14 shows a flow diagram of a method to reduce time series data and detect outlier data points in the time series data maintained in a data-storage device.

FIG. 14 shows a flow diagram of a method to reduce time series data and detect outlier data points in the time series data maintained in a data-storage device. The time series data 1402 may be time series metric data generated by a physical or virtual object of a distributed computing system. The time series data 1402 may be stored in a data-storage device, such as a mass-storage array, of the physical data center 1302. In block 1404, outlier data points and clusters of time series data within the time series data 1402 are determined based on a set of quantiles. In block 1406, excluding the outliers, each cluster of time series data is quantized based on the quantiles to generate quantized time series data and the outlier data points. In general, quantization 1406 causes a loss of information recorded in the time series data. Quantization 1406 is performed subject to a limit on the loss of information, $\Delta$. The limit on the loss of information defines an acceptable amount of information loss 1408 due to quantization. In block 1410, the quantized time series data is compressed to reduce the number of consecutive duplicate or repetitive quantized data points in the quantized time series data. Compression 1410 is not applied to the outlier data points. Compressed time series data and outliers 1412 are output and used to replace the original time series data 1402 in the data-storage device. The compressed time series data and outliers 1412 occupy far less storage space than the original time series data 1402, freeing storage space in the data-storage device. The smaller data set of compressed time series data and outlier data points 1412 enables faster and more timely analysis by the management server 1338 to determine anomalous behavior, problems and characterization of the time series data. Note that outlier data points are retained and not subjected to quantization, because the outliers may contain information about anomalous behavior and problems that would be lost if the outlier data points where subjected to quantization as explained below.

A sequence of time series data is denoted by $$x_k = x(t_k), k=1, \ldots, N \qquad (1)$$

where subscript k is a time index;
N is the number of data points;
$x(t_k)$ is a data point; and
$t_k$ is a time stamp that represents when the data point is recorded in a data-storage device.

The collection of time series data in Equation (1) may be also be represented as a sequence $X=\{x_k\}_{k=1}^N$.

Figure 15:
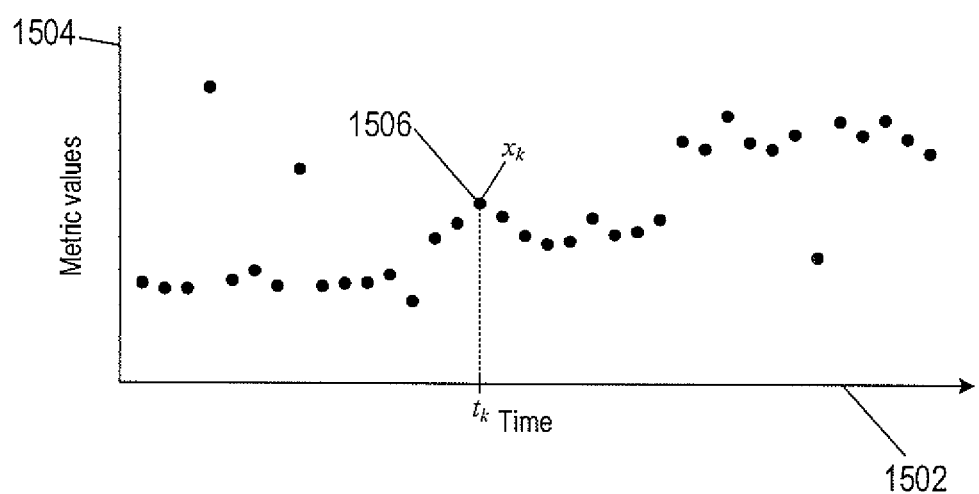
FIG. 15 shows a plot of example time series data.

FIG. 15 shows a plot of example time series data comprising 36 data points. Horizontal axis 1502 represents time. Vertical axis 1504 represents a range of metric data values. Dots represent individual data points recorded in the data storage device at corresponding time stamps. For example, dot 1506 represents a data point $x_k$ recorded at a time stamp $t_k$. The time series data may represent metric data generated by a physical or a virtual object. For example, the time series data may represent CPU usage of a core in a multicore processor of a server computer at each time stamp. Alternative, the time series data may represent the amount of virtual memory a VM uses at each time stamp.

Returning to FIG. 14, clusters and outliers 1404 of the time series data are determined prior to quantization 1406. Clusters are determined based on a number K of quantiles denoted by $q_1, q_2, \ldots, q_K$. The quantiles satisfy the condition $\min(X) \leq q_j \leq \max(X)$, where $j=1, \ldots, K$. The set of quantiles $\{q_j\}_{j=1}^K$ divides the time series data into K+1 groups of data points based on the values of the data points in the time series data. Each group contains about the same fraction, or number, of data points of the time series data. For example, each group may contain N/(K+1) data points in each group where K+1 evenly divides N. On the other hand, K+1 may not divide N evenly and certain groups may contain one or two more data points than other groups.

Methods determine a set of quantiles $\{q_j\}_{j=1}^K$ with a minimum K value such that the distance between the time series data X and quantized time series data $X^q$ satisfies a user defined limit on the loss of information $\Delta$ (i.e., minimum accuracy). For each value of $K=1, 2, 3, \ldots$, the set of quantiles $\{q_j\}_{j=1}^K$ are an initial set of centroids in an iterative process of determining K clusters of time series data. In particular, the K quantiles are used as initial mean values (i.e., initial K centroids) for K clusters of the time series data. The values of the K quantiles are iteratively changed to the K centroids of the K clusters and each data point $x_k$ in the time series data is assigned to a cluster in each iteration. Each cluster of data points is defined by $$C_i^{(m)}=\{x_k : |x_k-q_i^{(m)}| \leq |x_k-q_j^{(m)}| \forall j, 1 \leq j \leq K\} \quad (2)$$

where
$C_i^{(m)}$ is the i-th cluster $i=1, 2, \ldots, K$; and
m is an iteration index $m=1, 2, 3, \ldots$.

The value of the quantile $q_i^{(m)}$ is assigned the mean value of the i-th cluster determined by Equation (2) as follows $$q_i^{(m+1)} = \frac{1}{|C_i^{(m)}|} \sum_{x_k \in C_i^{(m)}} x_k \quad (3)$$

where $|C_i^{(m)}|$ is the number of data points in the i-th cluster.

Equation (2) is used to assign data points to the i-th cluster of data points. Equation (3) is used to compute the centroid of the i-th cluster. The operations represented by Equations (2) and (3) are repeated until the data points assigned to the K clusters does not changed.

The time series data in each cluster is assumed to be normally distributed about the centroid of the cluster. Consider a set of centroids $Q=\{q_1^c, q_2^c, \ldots, q_K^c\}$ each iteratively determined using Equations (2) and (3). Suppose $x_k^{(j)}$ is a data point that belongs to the j-th cluster $C_j$ with centroid $q_j^c$. For $j=1, 2, \ldots, K$, a normalcy range for the j-th cluster $C_j$ comprises the data points in the interval:

$$Q_j=[q_j^c-B^*\mathrm{std}(x_k^{(j)}-q_j^c), q_j^c+B^*\mathrm{std}(x_k^{(j)}-q_j^c)] \quad (4)$$

where
$\mathrm{std}(\bullet)$ is the standard deviation; and
B represents the number of standard deviations from the centroid $q_j^c$ of the j-th cluster $C_j$.

The width of the normalcy range is determined by the parameter B. The normalcy range comprises the data points that are located within B standard deviations of the centroid $q_j^c$. When the parameter B is large (e.g., approaches infinity), all of the data points of the j-th cluster $C_j$ belong to the normalcy range $Q_j$. On the hand, when the parameter B is smaller (e.g., when the parameter B equals 2 or 3) the normalcy range $Q_j$ comprises data points in the j-th cluster $C_j$ that are within B standard deviations of the centroid $q_j^c$. Data points located outside the K normalcy ranges are identified as outlier data points. The union of the normalcy ranges forms a normalcy domain of the time series data given by $$Q = \bigcup_{j=1}^K Q_j \quad (5)$$

The normalcy domain of the time series data contains R number of data points of the time series data, where $R \leq N$. Data points located outside the normalcy domains are called outliers. The outlier data points form a set of outliers represented by $X^o$. The number of outlier data points in the set $X^o$ is given by the difference N−R. Quantization and compression are applied to the data points in the normalcy domain of the time series data Q and not to outlier data points in the set of outliers $X^o$.

Quantization 1404 of time series data 1402 of FIG. 14 is carried by determining quantized time series data from the time series data and the K centroids. Quantized data points obtained from the data points in the normalcy domain of the time series data Q are denoted by $$x_{k'}^q = x^q(t_{k'}), k'=1, \ldots, R \quad (6)$$

The sequence of quantized time series data is represented by $X^q=\{x_{k'}^q\}_{k'=1}^R$, which does not include the set of outlier data points $X^o$. The quantized time series data $X^q$ is created from the time series data in Q. Each quantized data point $x_k^q$, in the quantized time series data $X^q$ has a corresponding data point $x_k$ in Q. Quantization assigns to each quantized data point $x_k^q$, the value of the centroid in the set of quantiles $\{q_j^c\}_{j=1}^K$ that is closest to the corresponding data point $x_k$ in Q. For a data point $x_k$ in Q, the closest unique centroid is given by $$\underset{j=1,\ldots,K}{\arg\min} |x_k - q_j^c| = q_{j_o}^c \quad (7)$$

where $q_{j_o}^c \in \{q_j^c\}_{j=1}^K$ is the closest unique centroid to the data point $x_k$.

The corresponding quantized data point $x_k^q$, of the quantized time series data $X^q$ is assigned the value of the quantile $q_{j_o}^c$ closest to the data point $x_k$. A data point $x_k$ in Q that is located midway between two quantiles, has two closest non-unique quantiles given by:

$$\operatorname{argmin}_{j=1,\ldots,K}|x_k - q_j^c| = q_{j_o}^c \text{ and } \operatorname{argmin}_{j=1,\ldots,K}|x_k - q_j^c| = q_{j_o+1}^c \quad (8)$$

where $q_{j_o}^c, q_{j_o+1}^c \in \{q_j^c\}_{j=1}^K$ are adjacent quantiles.

The data point $x_k$ is located midway between two adjacent centroids $q_{j_o}^c$ and $q_{j_o+1}^c$. In this case, when the preceding quantized data point $x_{k-1}^q$ equals either $q_{j_o}^c$ and $q_{j_o+1}^c$, the quantized data point $x_k^q$ is assigned the value of $x_{k-1}^q$. Otherwise, when the preceding quantized data point $x_{k-1}^q$ does not equal either $q_{j_o}^c$ and $q_{j_o+1}^c$, then $x_k^q$ is assigned the larger of $q_{j_o}^c$ and $q_{j_o+1}^c$. Alternatively, $x_k^q$ is assigned the smaller of $q_{j_o}^c$ and $q_{j_o+1}^c$.

The loss of information due to quantization of time series data can be measured between the quantized time series data $X^q$ and the time series data X using any one of the following loss functions ("LFs"):

$$LF_1(X^q, X) = l_1 = \frac{1}{R}\sum_{k'=1}^R |x_{k'} - x_{k'}^q| \quad (9)$$

$$LF_2(X^q, X) = l_2 = \frac{1}{R}\sum_{k'=1}^R |x_{k'} - x_{k'}^q|^2 \quad (10)$$

and $$LF_{max}(X^q, X) = l_{med} = \operatorname{median}|x_{k'} - x_{k'}^q| \quad (11)$$

The value of a loss function is a measure of how much the quantized time series data $X^q$ differs from the time series data X. The larger a loss function value is, the farther, or more distant, the quantized time series data $X^q$ is from the time series data X. Any one of the loss functions given by Equations (9), (10), and (11) may be used as a metric to determine the distance between the quantized time series data $X^q$ and the time series data X.

Let $\Delta$ be a limit on the loss of information (i.e., accuracy) 1408 for the quantization 1406 in FIG. 14. Methods are directed to determining a set of centroids $\{q_1^c, q_2^c, \ldots, q_K^c\}$ such that K is a minimum and the loss function value (i.e., distance) between the quantized time series data $X^q$ and the time series data in the normalcy domain of the time series data Q satisfies the condition:

$$LF(X^q, X) \leq \Delta \quad (12)$$

where the loss function is any one or the loss functions given by Equations (9), (10), and (11).

In other words, the process of iteratively minimizing K stops when the loss function is less than or equal to the limit on the loss of information $\Delta$.

When a minimum number K of centroids has been determined according to the condition of Equation (12), compression 1410 is applied to the quantized time series data in order eliminate sequential repetitions, or consecutive duplications, of quantized data points $x_k^q$, from the quantized time series data $X^q$. In one implementation, compression is carried out by retaining the first data point in a sequential repetition of the quantized time series data and deleting other data points in the same sequence. In another implementation, the first and the last data points in a sequential repetition of the quantized time series data are retained and the data points between the first and last data points are deleted. The data points in the sequence of compressed time series data are denoted by:

$$x_{k''}^c = x^c(t_{k''}), k'' = 1, \ldots, M \quad (13)$$

where $M \leq N$.

The sequence of compressed time series data is represented by $X^c = \{x_{k''}^c\}_{k''=1}^M$.

The compression rate is given by:

$$CR = 100\frac{N-M}{N} \quad (14)$$

The compression rate is a measure of how much of the time series data X has been reduced to obtain the compressed time series data $X^c$. A large compression rate corresponds to a large amount of the quantized time series data having been removed as a result of compression. A small compression rate corresponds to small amount of the quantized time series data having been removed as a result of compression.

The sequence of combined compressed time series data combined with the outliers, $X^c \cup X^o$, may be used to replace the time series data X in the data-storage device. For example, the time series data may be deleted from the data-storage device and the compressed time series data combined with outlier data points may be written to the data-storage device. Alternatively, the time series data may be over written by the compressed time series data combined with outliers. The compressed time series data and outliers, $X^c \cup X^o$, occupies far less storage space than the original time series data, freeing storage space in the data-storage device. The smaller data set of compressed time series data also enables faster and more timely analysis by a management server. Because the outlier data points are retained, the outliers may be used to identify anomalous behavior and problems that would be lost if the outlier data points had been quantization as described above.

Figure 16:
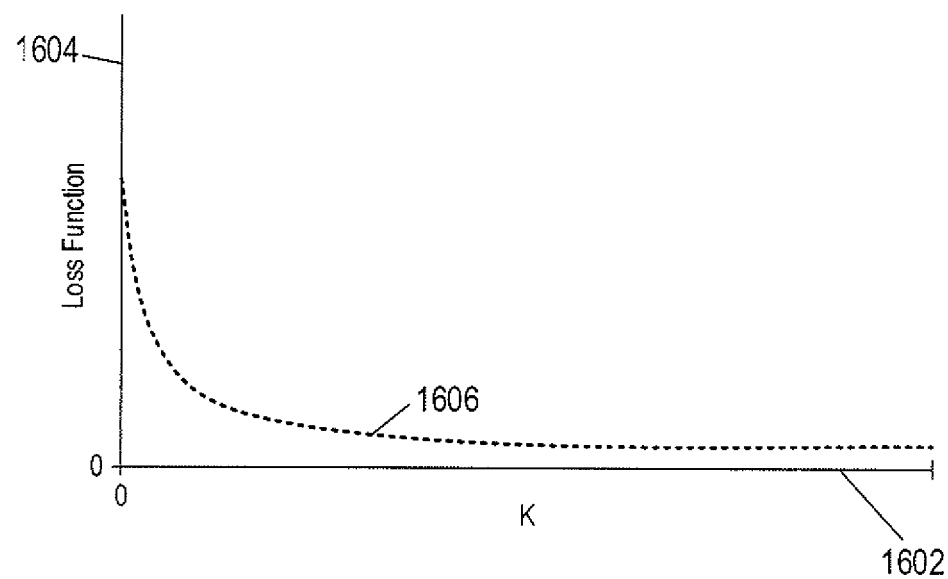
FIG. 16 shows a plot of loss function values.

Quantization creates a loss of information from the time series data. As the number of centroids K is increased, the amount of information lost is decreased, as represented in FIG. 16. FIG. 16 shows a plot of a loss function versus quantiles. Horizontal axis 1602 represents a range of values for the index K. Vertical axis 1604 represents a range of loss function values. Dashed curve 1606 represents the value of the loss function over K. Note that as the number K increases, the loss function decreases. The asymptotic portion of the loss function indicates that increasing K achieves only a marginal decrease or insignificant decrease in the loss of information from the time series data.

Figure 17:
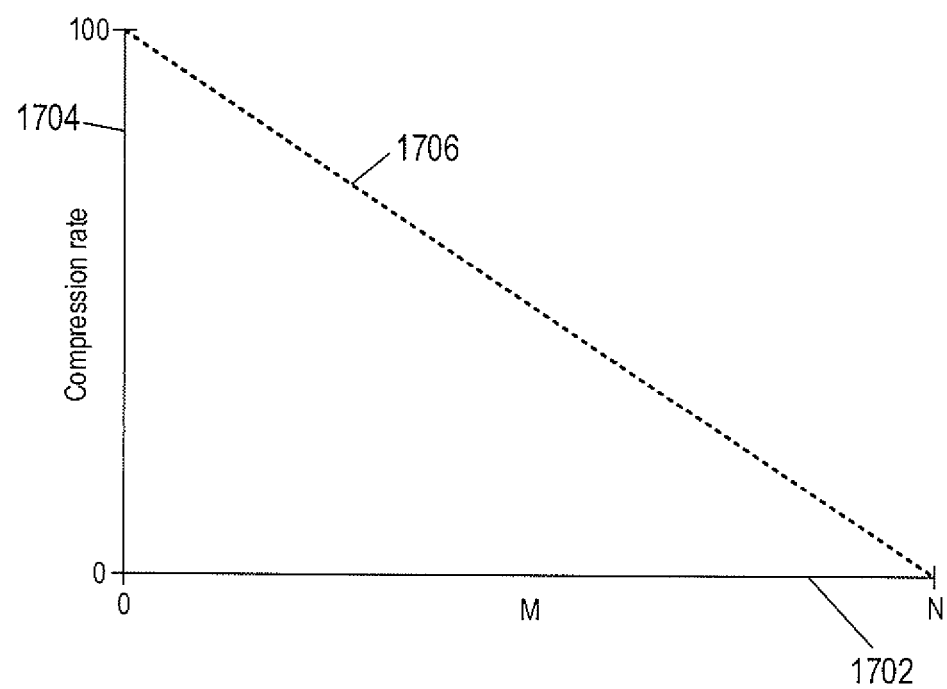
FIG. 17 shows a plot of the compression rate values.

Compression, on the other hand, is a lossless transformation of the quantized time series data. In other words, information is not lost from compressing the quantized time series data. The compression rate is a linear function of the number M of quantized data points in the compressed time series data. FIG. 17 shows a plot of the compression rate as a function M. Horizontal axis 1702 represents a range of values for M between 0 and N. Vertical axis 1704 presents the range of compression rate values between 0 and 100. Negatively sloped line 1706 represents the compression rate. A small compression rate (i.e., large M) indicates that compression has resulted in a small reduction in the amount of data stored. In other words, as the number M approaches the number N, the amount of data storage used to store the compressed time series data $X^c$ approaches the amount of data storage used to store the original time series data X. As the number M approaches zero, the amount of data storage used to store the compressed time series data $X^c$ is far less than the storage used to store the original time series data X.

FIGS. 18-20 illustrate an example of the operations represented by blocks 1404, 1406, and 1408 of FIG. 14 applied to the time series data represented in FIG. 15 for the index K equal to 1, 2, and 3.

Figure 18A:
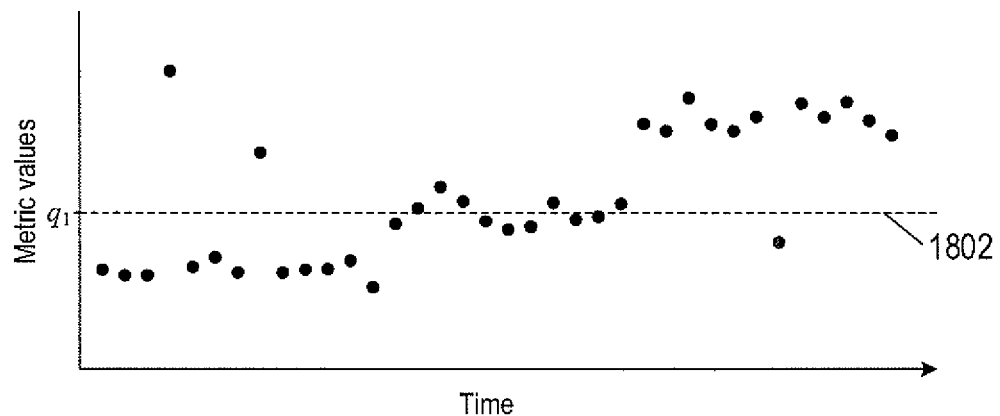
FIGS. 18A-18D show an example of clustering, quantizing and compressing applied to the time series data shown in FIG. 15 for K=1.

FIG. 18A shows an example of a single quantile $q_1$ for the 36 data points of the time series data with K=1. The quantile $q_1$ is the median of the time series data as represented by dashed line 1802. The quantile $q_1$ partitions the data points into two groups of 18 data points greater than $q_1$ and another 18 data points less than $q_1$. For K=1, the cluster is the entire sequence of time series data X. Equations (2) and (3) are applied to adjust the quantile $q_1$ to a mean value of the time series data which is the centroid $q_1^c$ of the time series data.

Figure 18B:
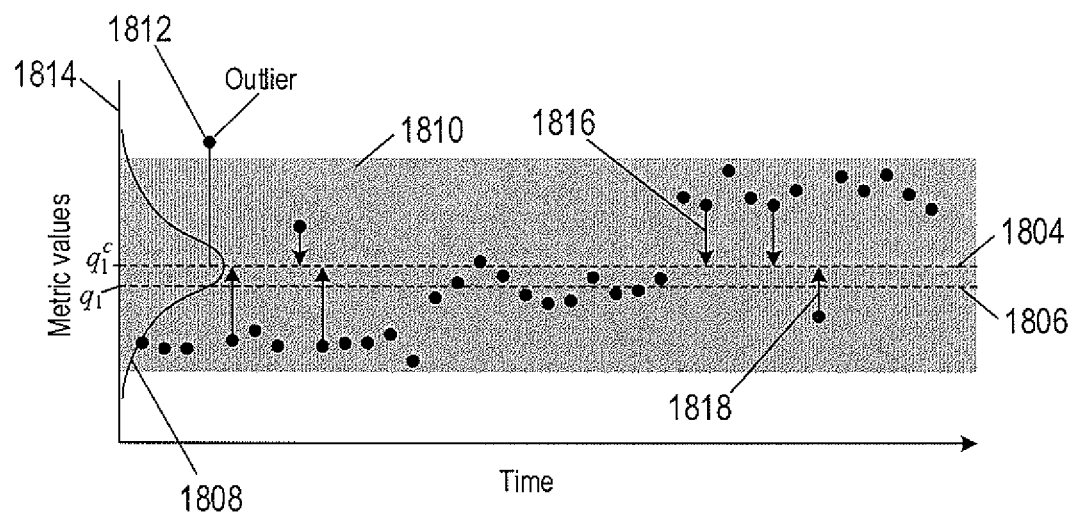

FIG. 18B shows a dashed line 1804 the represents the mean value or centroid $q_1^c$ of the time series data. Note that the centroid 1804 does not coincide with the median or quantile $q_1$ represented by a thin dashed line 1806. The values of the data points are distributed according to a normal distribution represented by curve 1808. Shaded region 1810 defines a normalcy domain for the cluster. The data points that lie within the normalcy domain 1810 are not outliers. Data point 1812 is an outlier because the data point 1812 is located within a tail 1814 of the distribution 1810. The data points within the normalcy domain 1810 are quantized to the centroid $q_1^c$, as represented by directional arrows, such as directional arrows 1816 and 1818.

Figure 18C:
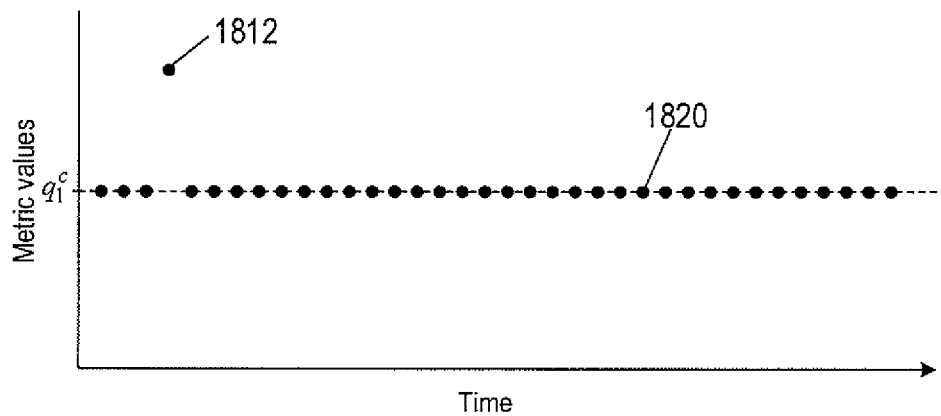

FIG. 18C shows the quantized time series data that result from quantization of the data points in the normalcy domain to the centroid $q_1^c$. The quantized time series data have the same value as the centroid $q_1^c$, such as quantized data point 1820, except the outlier data point 1812 is not included in the quantized time series data.

Figure 18D:
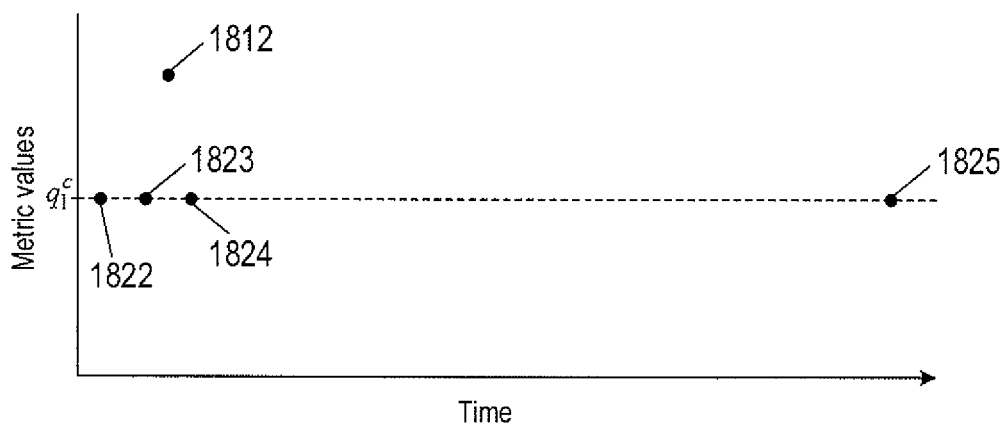

In one implementation, compression reduces subsequences of the quantized time series data of FIG. 18C to data points 1822-1825 and the outlier data point 1812 as illustrated in FIG. 18D. Alternatively, compression reduces the subsequences of the quantized time series data of FIG. 18C to data points 1822 and 1824 and the outlier data point 1812.

Figure 19A:
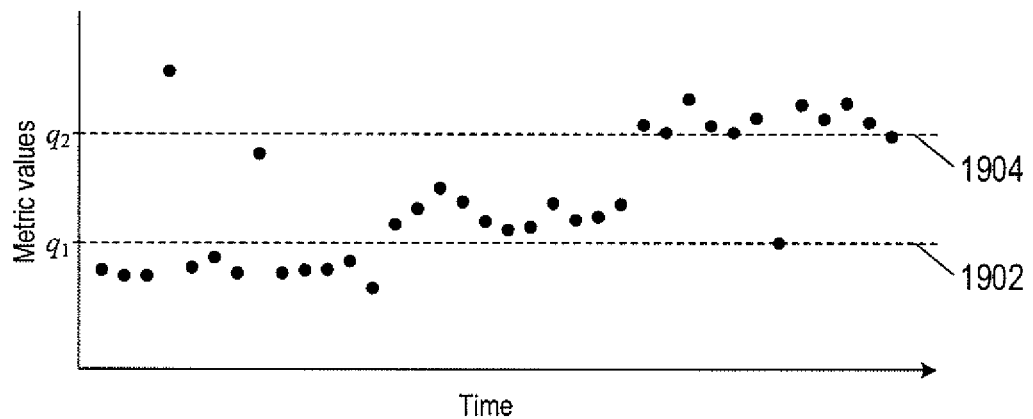
FIGS. 19A-19D show an example of clustering, quantizing and compressing applied to the time series data shown in FIG. 15 for K=2.

FIG. 19A shows an example of two quantiles $q_1$ and $q_2$ that partition the 36 data points of the time series data with K=2. The quantiles $q_1$ and $q_2$ are represented by dashed lines 1902 and 1904, respectively, which partition the data points into two groups of data points with 12 data points in each group. For K=2, the time series data is assumed to have two clusters. Equations (2) and (3) are applied iteratively to adjust the quantile $q_1$ to a centroid $q_1^c$ of a first cluster data points and adjust the quantile $q_2$ to a centroid $q_2^c$ of a second cluster of data points.

Figure 19B:
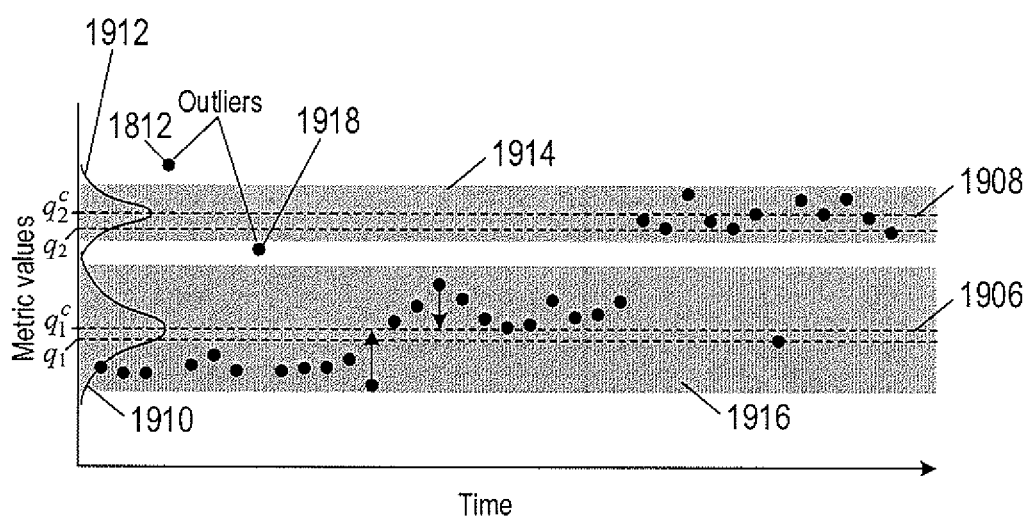

FIG. 19B shows dashed lines 1906 and 1908 that represent the centroids $q_1^c$ and $q_2^c$ of the first and second clusters of the time series data. The values of the data points in each cluster are distributed according to normal distributions represented by curves 1910 and 1912. Shaded region 1914 defines a normalcy domain for the first cluster. Shaded region 1916 defines a normalcy domain for the second cluster. The data points 1812 and 1918 lie outside the normalcy domains 1914 and 1916 and are identified as outliers. The data points within the normalcy domain 1914 are quantized to the centroid $q_1^c$. The data points within the normalcy domain 1916 are quantized to the centroid $q_2^c$.

Figure 19C:
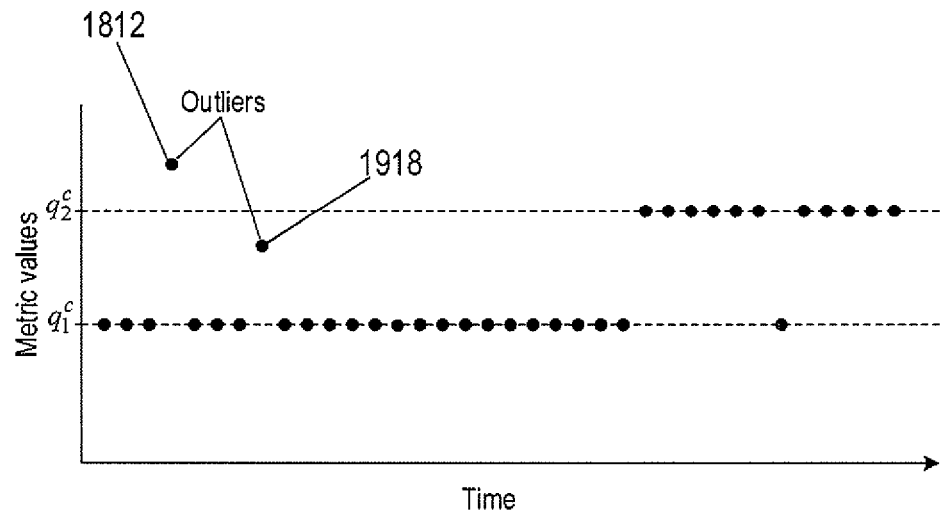

FIG. 19C shows the quantized time series data that result from quantization of the data points in the normalcy domains 1914 and 1916 to the centroids of and $q_2^c$, respectively. The outlier data points 1812 and 1918 are not part of the quantized time series data.

Figure 19D:
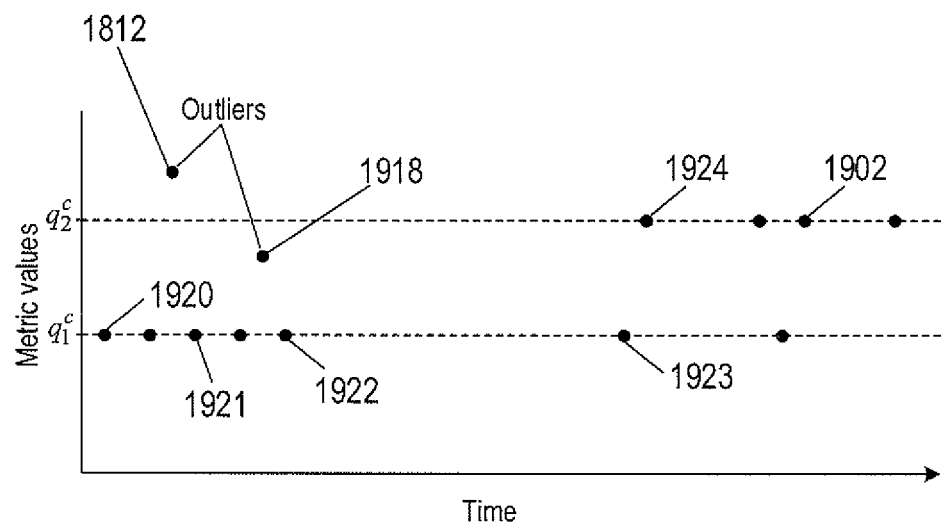

In one implementation, compression reduces subsequences of the quantized time series data of FIG. 19C to data points with centroids $q_1^c$ and $q_2^c$ and the outlier data points 1812 and 1918 as illustrated in FIG. 19D. Alternatively, compression reduces the quantized time series data of FIG. 19C to data points 1920-1925 and the outlier data points 1812 and 1918.

Figure 20A:
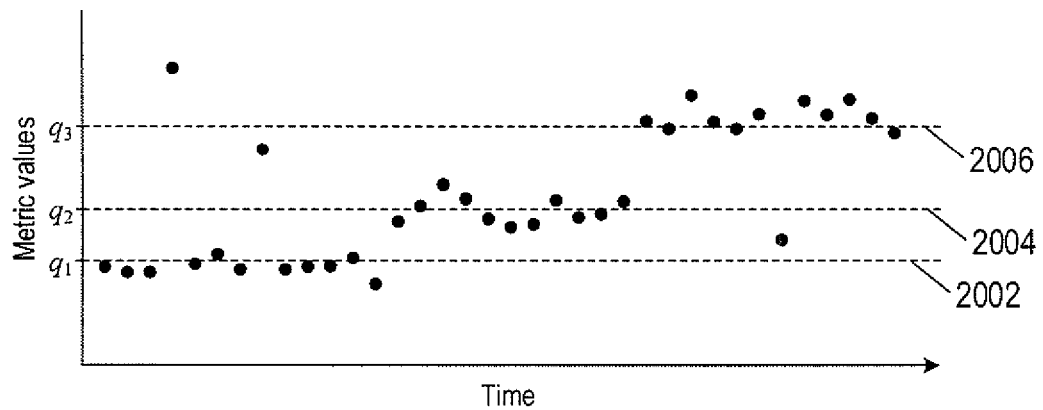
FIGS. 20A-20D show an example of clustering, quantizing and compressing applied to the time series data shown in FIG. 15 for K=3.

FIG. 20A shows an example of three quantiles $q_1$, $q_2$, and $q_3$ that partition the 36 data points of the time series data with K=3. The quantiles $q_1$, $q_2$, and $q_3$ are represented by dashed lines 2002, 2004, and 2006, respectively, which partition the data points into four groups of data points with 9 data points in each group. For K=3, the time series data are assumed to have three clusters of data points. Equations (2) and (3) are applied iteratively to adjust the quantile $q_1$ to a centroid $q_1^c$ of the first cluster, adjust the quantile $q_2$ to a centroid $q_2^c$ of the second cluster, and adjust the quantile $q_3$ to a centroid $q_3^c$ of the third cluster.

Figure 20B:
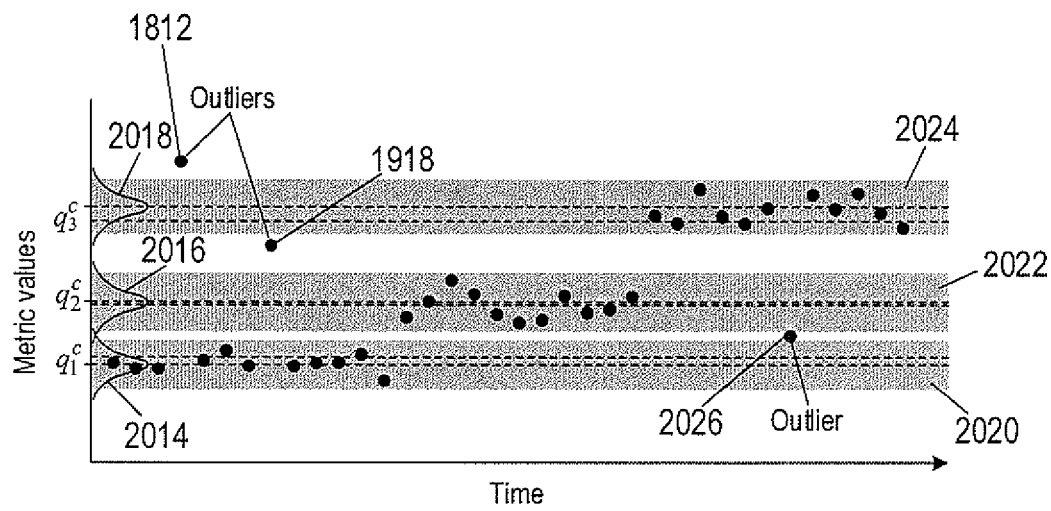
Figure 20C:
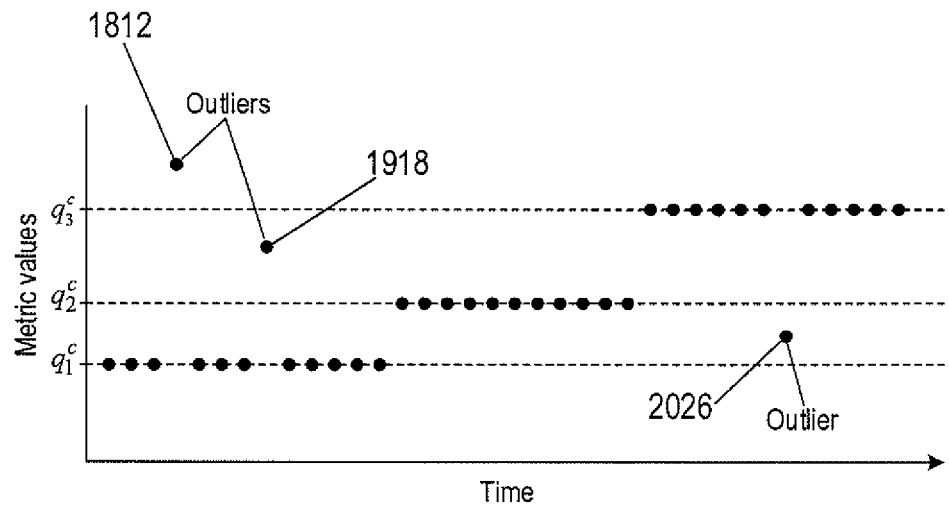

FIG. 20B shows dashed lines 2008, 2010, and 2012 that represent the centroids $q_1^c$, $q_2^c$, and $q_3^c$ of the first, second, and third clusters of the time series data. The values of the data points in each cluster are distributed according to normal distributions represented by curves 2014, 2016, and 2018. Shaded region 2020 defines a normalcy domain for the first cluster of data points. Shaded region 2022 defines a normalcy domain for the second cluster of data points. Shaded region 2024 defines a normalcy domain for the third cluster of data points. The data points 1812, 1918, and 2026 lie outside the normalcy domains 2020, 2022, and 2024 are identified as outliers. The data points within the normalcy domain 2020 are quantized to the centroid $q_1^c$. The data points within the normalcy domain 2022 are quantized to the centroid $q_2^c$. The data points within the normalcy domain 2024 are quantized to the centroid $q_3^c$ FIG. 20C shows the quantized time series data that result from quantization of the data points in the normalcy domains 2020, 2022, and 2024 to the centroids $q_1^c$, $q_2^c$, and $q_3^c$, respectively. The outlier data points 1812, 1918, and 2026 are not part of the quantized time series data.

Figure 20D:
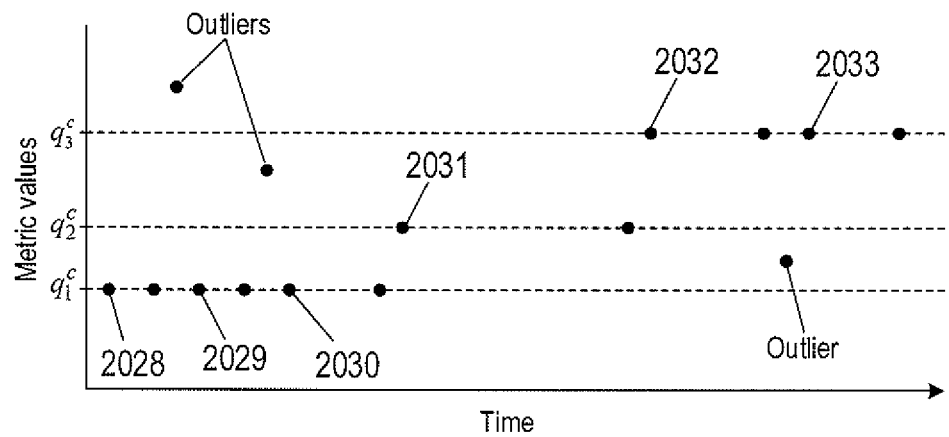

In one implementation, compression reduces the quantized time series data of FIG. 20C to data points with centroid values $q_1^c$, $q_2^c$, and $q_3^c$ and the outlier data points 1812, 1918, and 2026 as illustrated in FIG. 20D. In another implementation, compression reduces the quantized time series data of FIG. 20C to data points 2028-2033 and the outlier data points 1812, 1918, and 2026.

Suppose the distance between the quantized time series data shown in FIG. 20C and the original time series data show in FIG. 20A satisfies the condition $d(X^q, X) \leq \Delta$, then the minimum K is equal to 3 and the compressed time series data and outlier data points shown in FIG. 20D may be used to replace the original time series data, shown in FIG. 15, in the data-storage device, which decreases the amount of storage space used to store the time series data.

Figure 21:
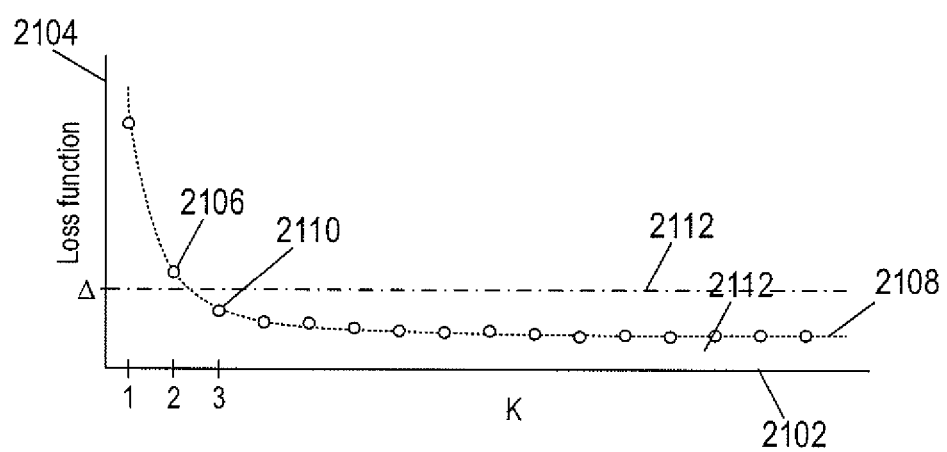
FIG. 21 shows a plot of an example loss function values versus index K.

FIG. 21 shows a plot of an example loss function values versus index K. Horizontal axis 2102 represents a range of K values. Vertical axis 2104 represents a range of loss function values. Dots, such as dot 2106, represent the loss function value calculated for each K integer value. Dotted curve 2108 tracks the overall value of the loss function as K increases. The loss function is largest for K equal to "1" and takes a sharp drop in value at K equal to "2." The loss function then approaches an asymptote for values greater than 3. The decrease in loss function values as K increases demonstrates that increasing K beyond the point where the loss function value 2110 is less than the limit on the loss of information $\Delta$ as represented by dot-dash line 2112 does not significantly decrease the loss of information due to quantization. Therefore, the iterative process of minimizing K as described above with reference to the example illustrated in FIGS. 18-20 stops when the value of the loss function is less the limit on the loss of information Δ.

Figure 22:
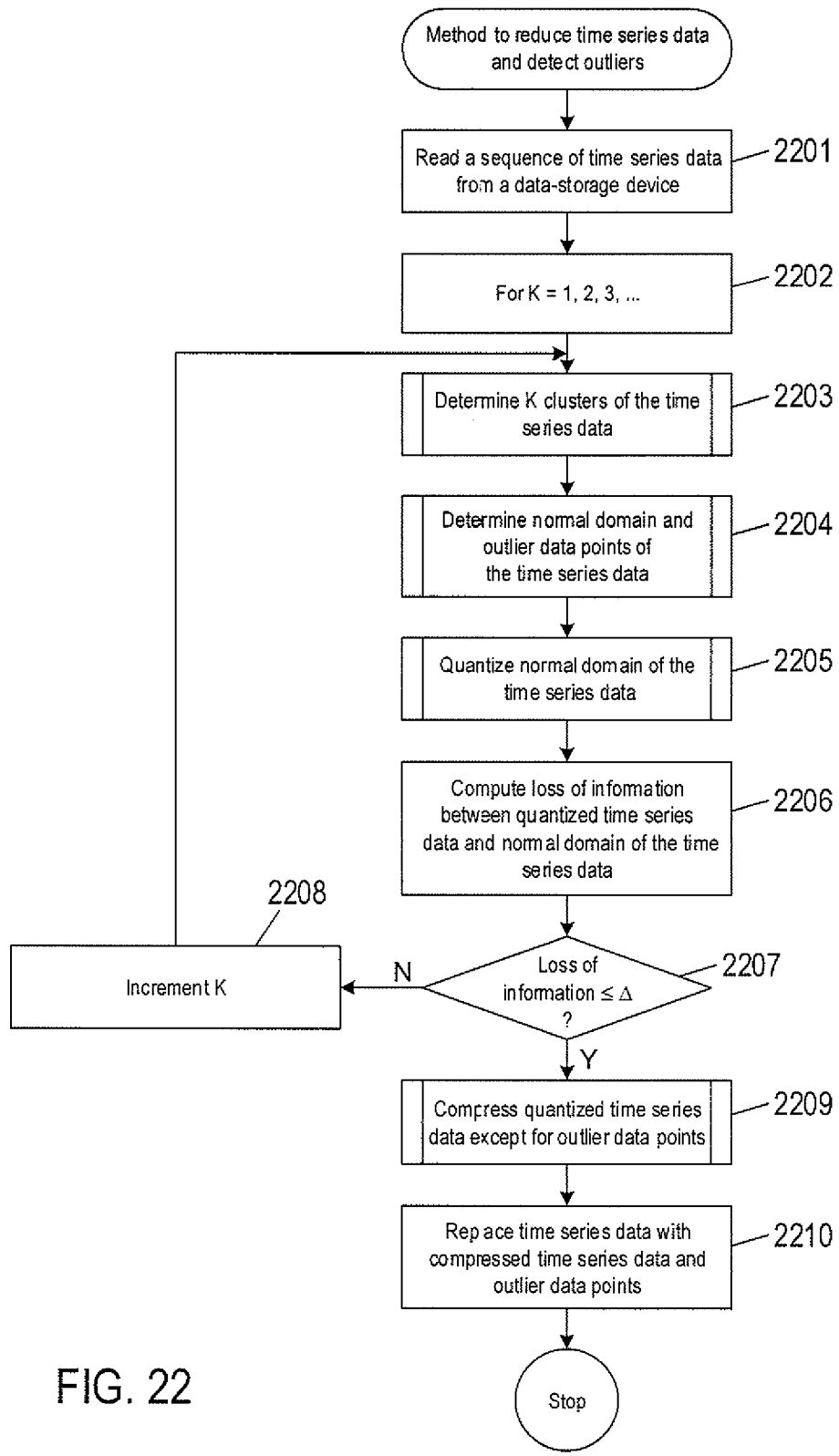
FIG. 22 shows a control-flow diagram of a method to reduce time series data and detect outliers.

FIG. 22 shows a control-flow diagram of a method to reduce time series data and detect outliers. In block 2201, a sequence time series data is read from a data-storage device. A loop beginning with block 2202, repeats to operations represented by blocks 2203-2208 until a minimum K is determined. In block 2203, a routine "determine K clusters of the time series data" is called. In block 2204, a routine "determine normalcy domain and outlier data points of the time series data" is called. In block 2205, a routine "quantize normalcy domain of the time series data" is called. In block 2206, loss of information between the quantized time series data and the normalcy domain of the time series data is computed. In decision block 2207, when the loss of information is less than or equal to a limit on the loss of information due to quantization, control flows to block 2209. Otherwise, control flows to block 2208 and the parameter K is incremented. In block 2209, a routine "compress quantized time series data except of the outlier data points" is called. In block 2210, time series data stored in the data-storage device is replaced by compressed time series data and the outlier data points.

Figure 23:
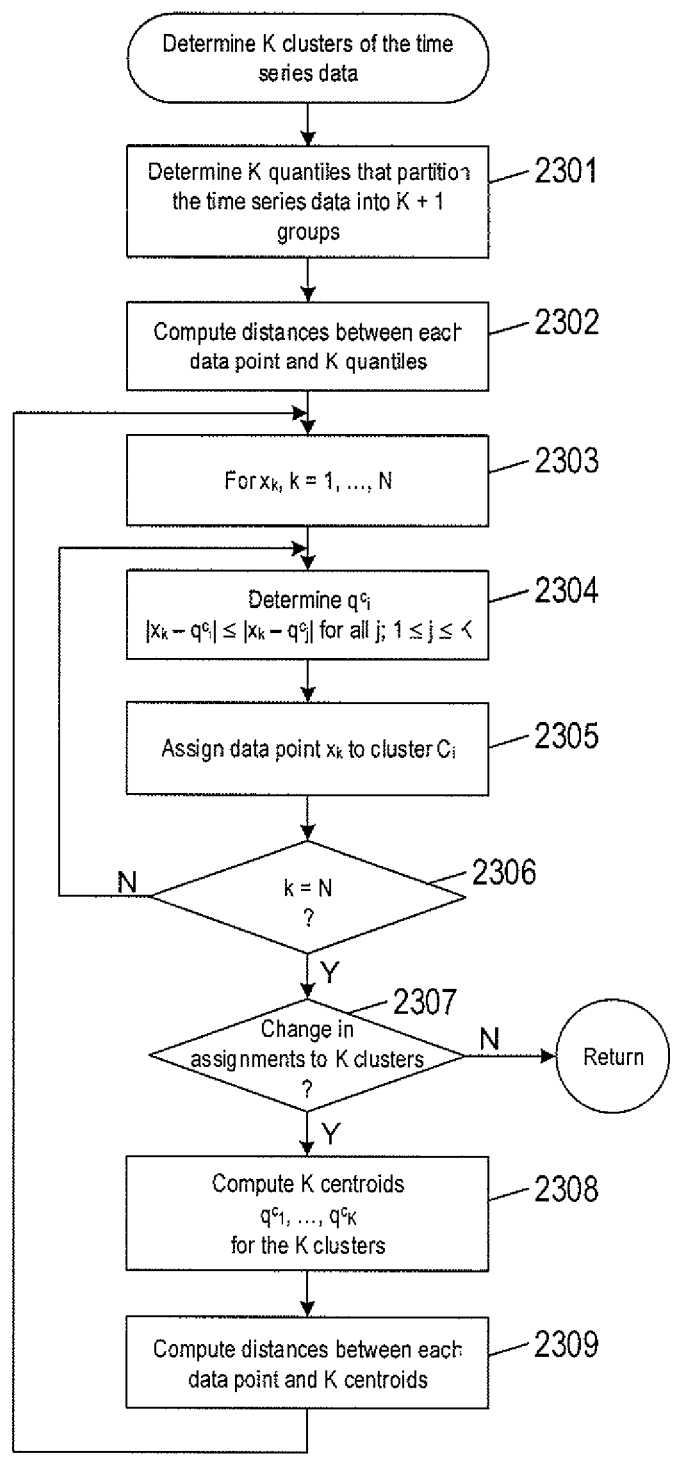
FIG. 23 shows a control-flow diagram of the routine "determine K clusters of the time series data" called in FIG. 22.

FIG. 23 shows a control-flow diagram of the routine "determine K clusters of the time series data" called in block 2203 of FIG. 22. In block 2301, K quantiles that partition the time series data into K+1 groups data points are determined as described above. In block 2302, distances between each data point of the time series data and each of the K quantiles are computed. A loop beginning with block 2303 repeats the operations of blocks 2304 and 2305 for each data point in the time series data. In block 2304, the smallest distance $|x_k - q_i^c|$ of the distances $|x_k - q_j^c|$, where j=1, . . . , N, is determined as described above with reference to Equation (2). In block 2305, the data point $x_k$ is assigned to the cluster C that corresponds to the smallest distance $|x_k - q_i^c|$ determined in preceding block 2304. In decision block 2306, when the time series index k equals the number of data points N, control flows to decision block 2307. In decision block 2307, when there is no change to the data point assignments to the K clusters, the routine returns. Otherwise, control flows to block 2308. In block 2308, the centroids of each cluster are recalculated as described above with reference to Equation (3). In block 2309, distances between each data point of the time series data and each of the K centroids are computed.

Figure 24:
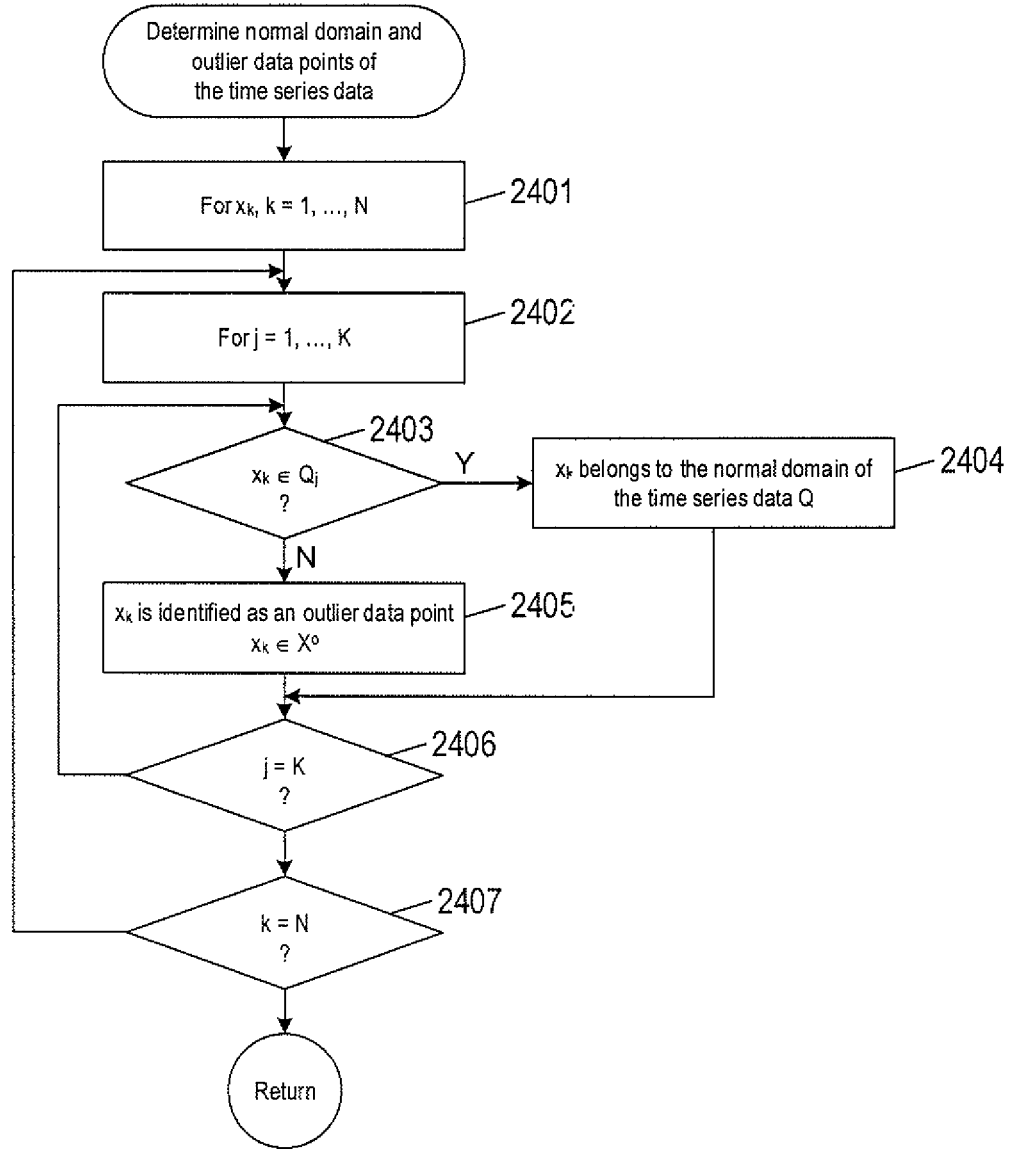
FIG. 24 shows a control-flow diagram of the routine "determine normalcy domain and outlier data points of the time series data" called in FIG. 22.

FIG. 24 shows a control-flow diagram of the routine "determine normalcy domain and outlier data points of the time series data" called in block 2204 of FIG. 22. A loop beginning with block 2401 repeats the operations of blocks 2402-2406 for each data point in the time series data. A loop beginning with block 2402 repeats the operations of blocks 2403-2406 for each cluster. In decision block 2403, if a data point $x_k$ is within the interval defined by the normalcy range $Q_j$ described above with reference to Equation (4), control flows to block 2404. Otherwise, control flows to block 2405. In block 2404, the data point $x_k$ is identified as belonging to the normalcy domain of the time series data Q. In block 2405, the data point $x_k$ is identified as an outlier data point. In decision block 2406, when j equals the number of clusters K, control flows to decision block 2407. In decision block 2407, when k equals the number of data points N, the routine returns.

Figure 25:
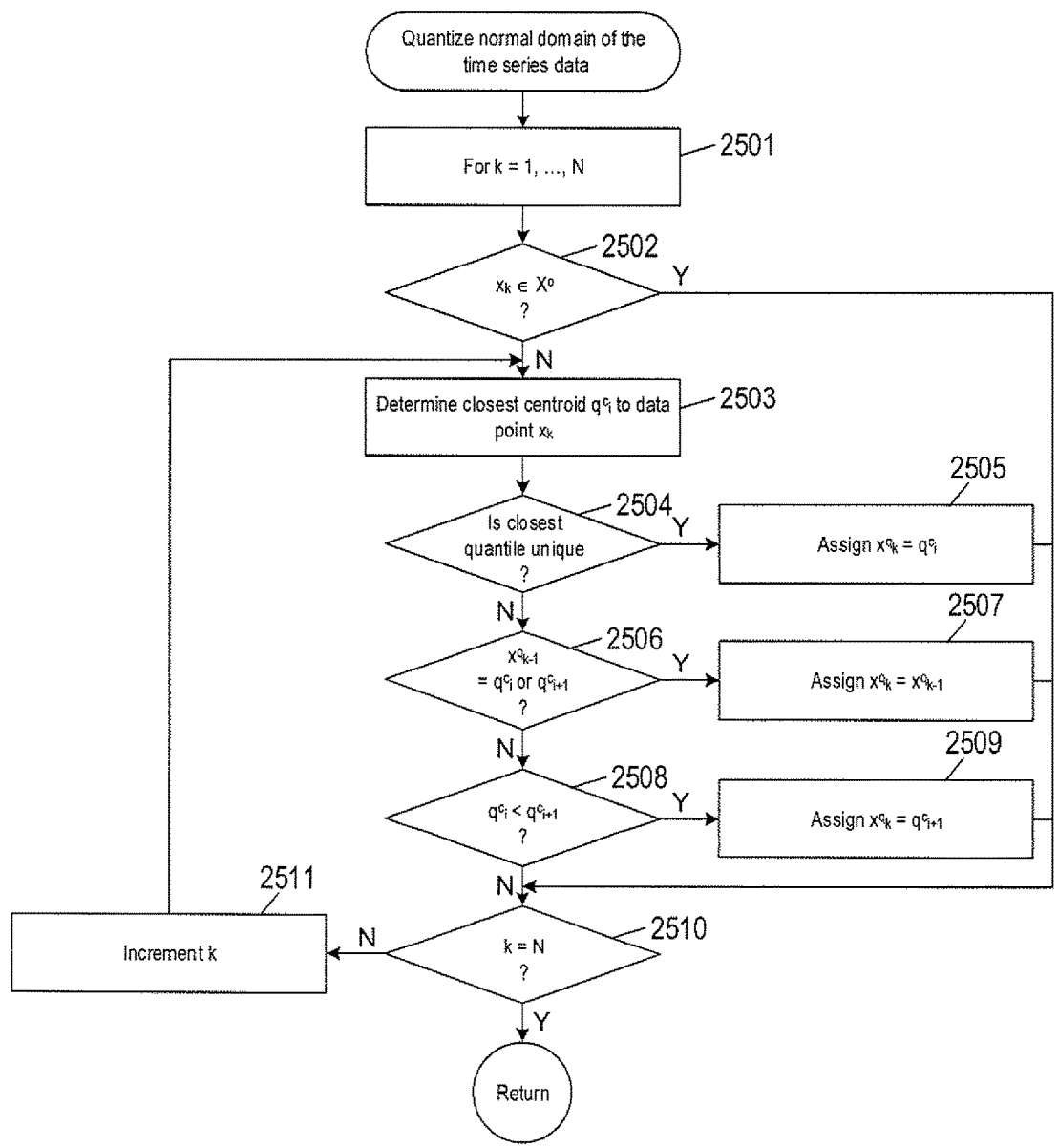
FIG. 25 shows a control-flow diagram of the routine "quantize normalcy domain of the time series data" called in FIG. 22.

FIG. 25 shows a control-flow diagram of the routine "quantize normalcy domain of the time series data" called in block 2205 of FIG. 22. A loop beginning with block 2501 repeats the computational operations represented by blocks 2502-2511 for each data point in the sequence of time series data. In decision block 2502, when a data point has not been identified as an outlier, control flows to block 2503. Otherwise, the data point is skipped for quantization and control flows to decision block 2510. In block 2503, the closest centroid of the K centroids to the data point $x_k$ is determined as described above with reference to Equation (7). In decision block 2504, if the closest quantile is unique (i.e., the data point $x_k$ is not midway between two centroids $q_{j_o}^c$ and $q_{j_o+1}^c$ as described above with reference to Equation (7)), control flows to block 2504. In block 2505, the corresponding quantized data point $x_k^q$ is assigned the value of the closest centroid $q_{j_o}^c$ to the data point $x_k$ and added to the quantized time series data $X^q$, as described above with reference to FIGS. 18B, 19B, and 20B. In decision block 2506, when the preceding quantized data point $x_{k-1}^q$ is equal to either of the two centroids $q_{j_o}^c$ and $q_{j_o+1}^c$, control flows to block 2507. In block 2507, the quantized data point $x_k^q$ is assigned the value of the preceding quantized data point $x_{k-1}^q$. In decision block 2508, when $q_{j_o}^c$ is less than $q_{j_o+1}^c$, control flows to block 2509 and the quantized data point $x_k^q$ is assigned the larger value $q_{j_o+1}^c$. In decision block 2510, when k is not equal to N, control flows to block 2511 in which k is incremented.

Figure 26:
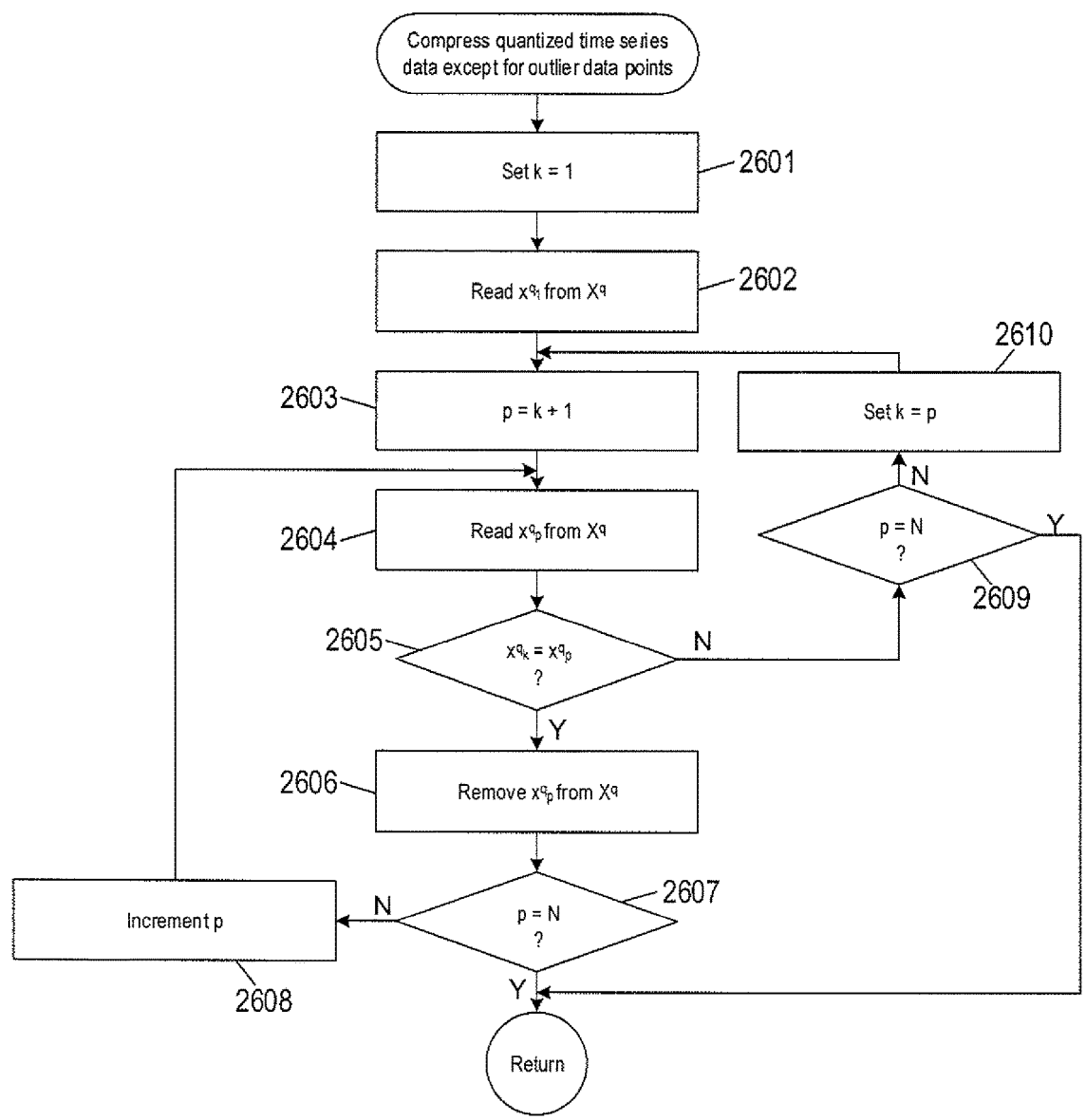
FIG. 26 shows a control-flow diagram of the routine "compress quantized time series data except of the outlier data points" called in FIG. 22.

FIG. 26 shows a control-flow diagram of the routine "compress quantized time series data except of the outlier data points" called in block 2209 of FIG. 22. In block 2601, the parameters k is initialized to "1." In block 2602, the quantized data point $x_k^q$ is read from the quantized time series data $X^q$. In block 2603, the parameter p is set equal to k+1. In block 2604, the quantized data point $x_p^q$ is read from the quantized time series data $X^q$. In decision block 2605, when the quantized data points $x_k^q$ and $x_p^q$ are equal, control flows to block 2606. Otherwise, control flows to block 2609. In block 2606, the quantized data point $x_p^q$ is removed from the quantized time series data $X^q$. In decision block 2607, when p is less than N control flows to block 2608 in which p is incremented. In decision block 2609, when p is less than N control flows to block 2610 in which k is assigned the value of p.

The method of FIGS. 22-26 automates the task of reducing the size of time series data stored in data-storage devices of a distributed computing system. The compressed time series data and outlier data points that replace the original time series data in block 2210 of FIG. 22 occupies far less storage space than the original time series data, freeing storage space in the data-storage device. The smaller compressed time series data and outlier data points also enables faster and more timely analysis by a management server. For example, the management server can process the compressed time series data and outlier data points in real time or near real time to search for anomalous behavior of a resource or object, identify problems with the resource, and characterize the compressed time series data. For example, an anomaly or problem may be identified when any one or more of the outlier data points violate a threshold. When an anomaly or problem is detected, the management server may generate an alert identifying the anomaly or problem, and because there is no significant delay, a system administrator is better able to respond accordingly.

Figure 27A:
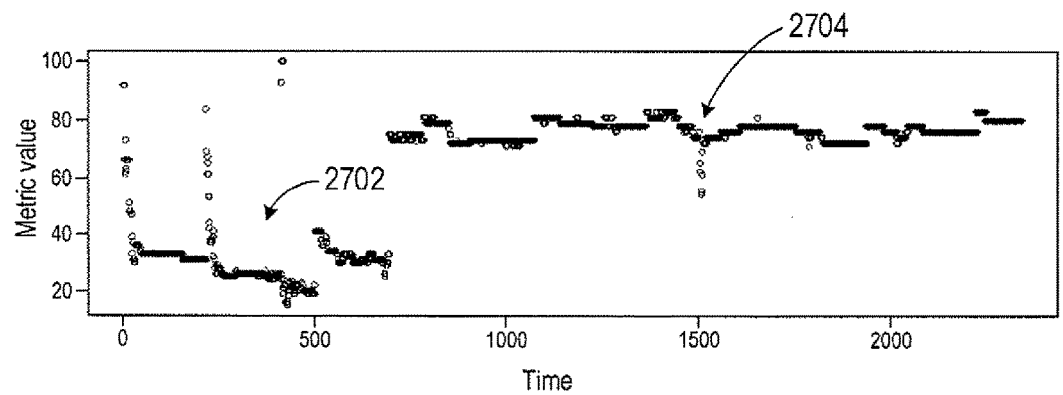
FIGS. 27A-27H show examples of quantization and compression applied to an actual sequence of time series data.

FIGS. 27A-27H show examples of quantization and compression applied to an actual sequence of time series data comprising 2346 data points. FIGS. 27A-27H demonstrate two types of coverage applied to the time series data shown in FIG. 27A. FIG. 27A shows an example of time series data with two different clusters 2702 and 2704. The two types of coverage are optimal coverage ("OC") and outlier optimal coverage ("OOC") are variations of the methods described above with respect to the choice for the parameter B of Equation (4). In the case of OC, the parameter B in Equation (4) is very large (e.g., B→∞). In the case of OOC, the parameter B is much smaller (e.g., B=3).

Figure 27B:
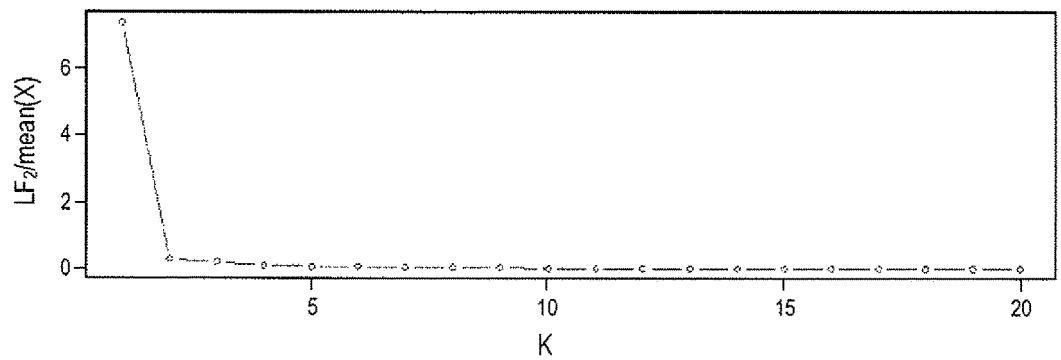
Figure 27C:
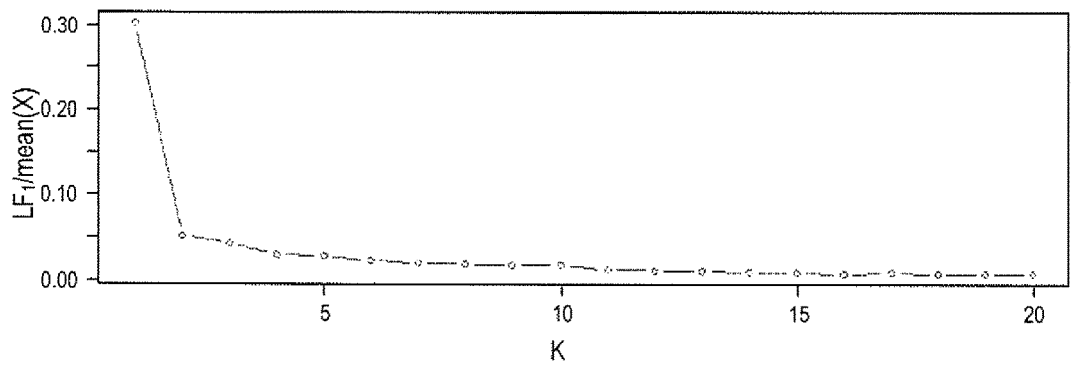
Figure 27D:
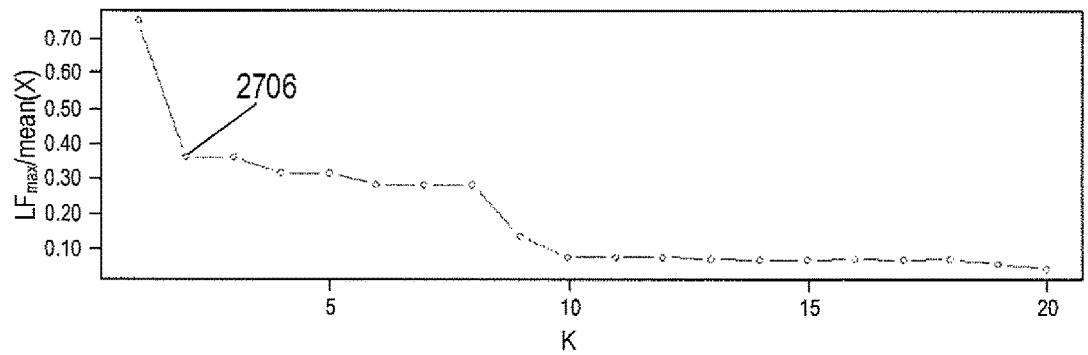
Figure 27E:
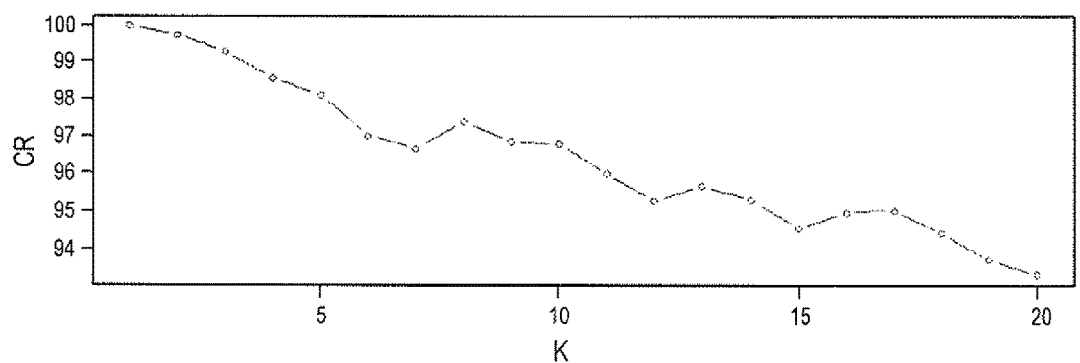
Figure 27F:
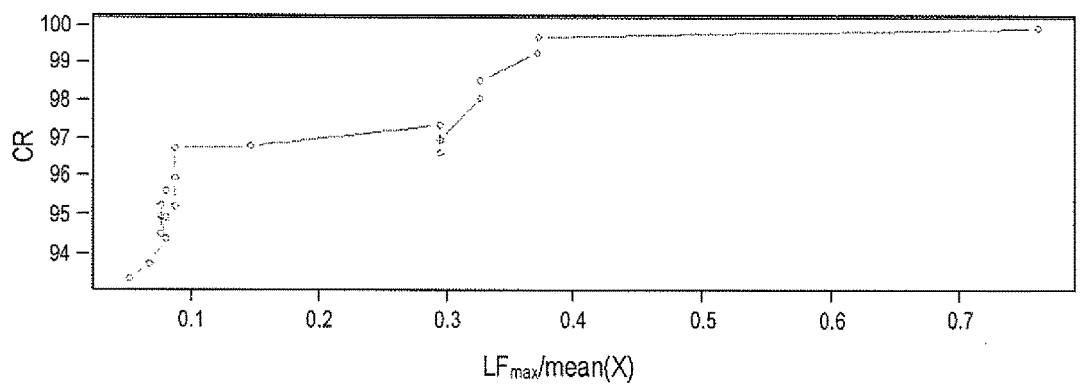
Figure 27G:
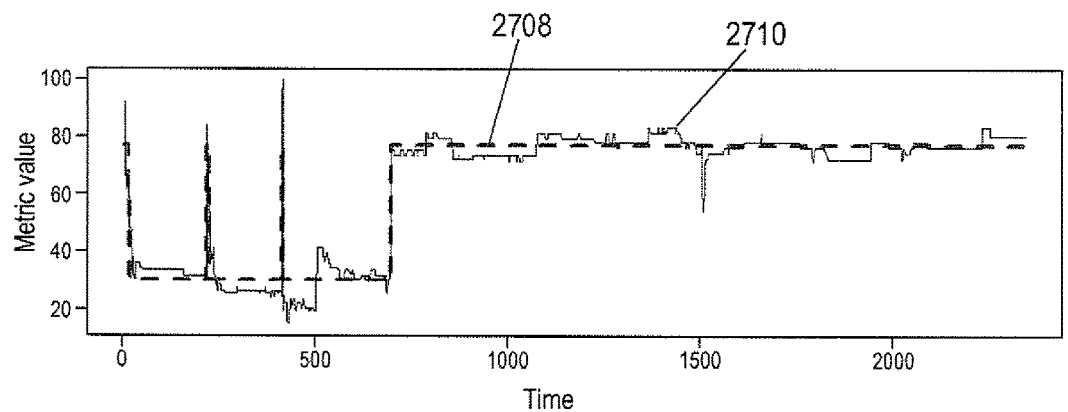

FIGS. 27B-27D show relative errors (i.e., loss function/mean(X)) corresponding to different number of clusters K for the three different loss functions for OC. In all cases, a significant drop in relative error occurs from K=1 to K=2. In FIG. 27D, another drop in relative error occurs from K=9 to K=10. For a limit on information loss where Δ=0.5, FIG. 27D shows that starting at K=2, the corresponding relative errors are smaller than 0.4 and the minimum value for K providing the required relative accuracy is K=2. The corresponding centroids of the two clusters 2702 and 2704 determined as described above are 29.7 and 76.5 with a relative error 2706 of $LF_{max}/mean(X)=0.37$ in FIG. 27D. FIG. 27E shows corresponding compression rates for different values of K. The compression rate corresponding to K=2 is between 99%-100%. FIG. 27F shows a plot of compression rates versus relative errors $LF_{max}/mean(X)$ aids in the selection of the limit on loss of information Δ. FIG. 27F shows an expected compression rate for different accuracies. Taking a slightly smaller Δ increases the compression rate by several percentage points. FIG. 27G shows a plot of the quantized time series data represented by dashed curve 2708 and solid curve 2710 that represents the original time series data show in FIG. 27A. FIGS. 27D-27G illustrate that the OC can be achieved for K=2 with the centroids 29.7 and 76.5 for the two clusters 2702 and 2704, respectively.

Figure 27H:
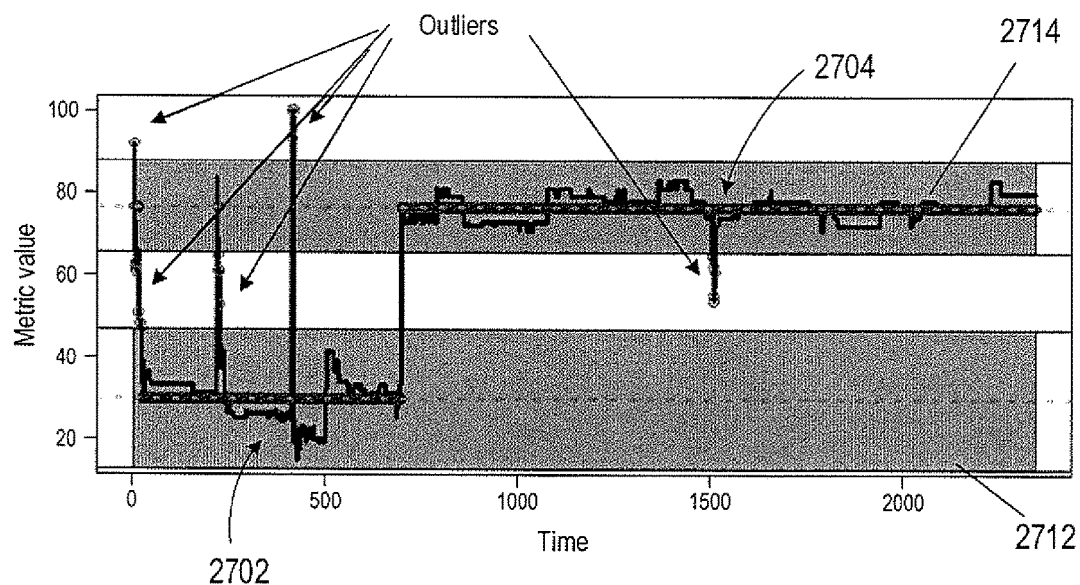

FIG. 27H shows a shaded region 2712 that corresponds to a normalcy domain of [12.7,46.7] for the first cluster 2702 and a shaded region 2714 that corresponds to a normalcy domain of [65.5,87.5] for the second cluster 2704 obtained for OOC. The normalcy domains 2702 and 2704 are created using a smaller parameter B=3 in Equation (4). Data points located outside normalcy domains 2712 and 2714 are outlier data points. With the outlier data points identified and not included in the quantization of the time series data, the relative error decreases to $LF_{max}/mean(X)=0.23$, which is less than 0.37 where the outlier data points were included in the quantization of FIG. 27G. Because the outlier data points are excluded from the compression, the compression rate is 98.8% for the data shown in FIG. 27H, which is lower than the compression rate of 99.7% for the compressed data shown in FIG. 27G where the outlier data points were quantized.

The results in FIGS. 27G and 27H demonstrate the differences between OOC and OC. FIG. 27G illustrates that when the error is 0.37, there are no outliers, all of data points are quantized to the centroids, which increases the compression rate. On the other hand, FIG. 27H illustrates that when the error is decreased to 0.23, the outliers are preserved, but the compression rate is lower by comparison.

In the implementation described above, quantiles are used as the initial centroids in the clustering process described above with reference to Equations (2) and (3). In an alternative implementation, the quantiles may be omitted as starting points for determining the centroids of the clusters of data points. Other approaches to determining an initial set of centroids may be applied followed by centroid-based clustering. For example, a first cluster center is chosen uniformly at random from the data points. Each subsequent cluster center is chosen from the remaining data points with a probability proportional to the centers distance from the data point closest to an existing cluster center. For K=1, 2, 3, . . . , the process proceeds as described above by determining clusters for each centroid, calculating the distances between the cluster data points from the corresponding centroids, adjusting the centroids, detection of outliers for a given parameter B, and determining a minimum K that quantizes the time series data with a respect to a limit on the loss of information Δ.

It is appreciated that the previous description of the disclosed embodiments is provided to enable any person skilled in the art to make or use the present disclosure. Various modifications to these embodiments will be apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A method stored in one or more data-storage devices and executed using one or more processors of a management server computer to reduce time series data generated by an object of a distributed computing system, the method comprising:
   determining clusters of data points of the time series data recorded in a data-storage device;
   determining a normalcy domain and outlier data points of the time series data, the normalcy domain comprising a union of one or more normalcy ranges, each normalcy range containing data points of one of the clusters with data values in an associated interval, and the outlier data points located outside the one or more normalcy ranges;
   quantizing time series data in the normalcy domain of the time series data to generate quantized time series data;
   compressing the quantized time series data to obtain compressed time series data when loss of information due to quantization is less than or equal to a loss of information limit; and
   replacing the time series data in the data-storage device with the compressed time series data and outlier data points to reduce an amount of data stored in the data-storage device.

2. The method of claim 1 wherein determining clusters of data points of the time series data comprises:
   determining quantiles that partition the time series data into groups of data points, each quantile representing an initial centroid of one cluster of the time series data;
   computing distances between each data point and the centroids;
   for each data point in the time series data, assigning each data point to the cluster with a minimum distance between the data point and the centroid of the cluster;
   computing a centroid for each of the clusters based on the data points assigned to the cluster; and
   repeating the computing distances between each data point and the centroids, assigning each data points to the cluster with a minimum distance, and computing a centroid for each cluster until assignment of data points to the clusters does not change.

3. The method of claim 1 wherein determining the normalcy domain and outlier data points comprises:
   for each data point in the time series data,
      identifying the data point as belong to the normalcy domain of the time series data when a value of the data point is within a normalcy range, and identifying the data point as an outlier data point, when a value of the data point is not located within any of the domain ranges.

4. The method of claim 1 wherein quantizing the time series data comprises:
for each data point of the time series data in the normalcy domain,
determining a closest centroid of the centroids to the data point; and
assigning a value of the closest centroid to the data point to a corresponding quantized data point in the quantized time series data.

5. The method of claim 1 wherein compressing the quantized time series data comprises:
computing a loss of information between the quantized time series data and the normalcy domain of the time series data; and
for each data point in the normalcy domain of the time series data,
determining each sequence of repeated quantized data points, and
deleting repeated quantized data points in each sequence of repeated quantized data points, leaving one quantized data point from each sequence.

6. The method of claim 5 wherein computing the loss of information between the quantized time series data and the normalcy domain of the time series data comprises computing a distance between the quantized time series data and the normalcy domain of the time series data.

7. The method of claim 1 wherein replacing the time series data in the data-storage device with the compressed time series data and the outlier data points comprises overwriting the time series data with the compressed time series data and the outlier data points.

8. The method of claim 1 wherein replacing the time series data in the data-storage device with the compressed time series data and the outlier data points comprises:
deleting the time series data from the data-storage device; and
writing the compressed time series data and the outlier data points to the data-storage device.

9. The method of claim 1 further comprising:
analyzing the compressed time series data and the outlier data points stored in the data-storage device to determine an anomaly or problem with the object that generated the time series data; and
generating an alert when an anomaly or problem is determined.

10. A system to reduce time series data generated by an object of a distributed computing system, the system comprising:
one or more processors;
one or more data-storage devices; and
machine-readable instructions stored in the one or more data-storage devices that when executed using the one or more processors controls the system to carry out
determining clusters of data points of the time series data recorded in a data storage device;
determining a normalcy domain and outlier data points of the time series data, the normalcy domain comprising a union of one or more normalcy ranges, each normalcy range containing data points of one of the clusters with data values in an associated interval, and the outlier data points located outside the one or more normalcy ranges;
quantizing time series data in the normalcy domain of the time series data to generate quantized time series data;
compressing the quantized time series data to obtain compressed time series data when loss of information due to quantization is less than or equal to a loss of information limit; and
replacing the time series data in the data-storage device with the compressed time series data and outlier data points to reduce an amount of data stored in the data-storage device.

11. The system of claim 10 wherein determining clusters of data points of the time series data comprises:
determining quantiles that partition the time series data into groups of data points, each quantile representing an initial centroid of one cluster of the time series data;
computing distances between each data point and the centroids;
for each data point in the time series data, assigning each data point to the cluster with a minimum distance between the data point and the centroid of the cluster;
computing a centroid for each of the clusters based on the data points assigned to the cluster; and
repeating the computing distances between each data point and the centroids, assigning each data points to the cluster with a minimum distance, and computing a centroid for each cluster until assignment of data points to the clusters does not change.

12. The system of claim 10 wherein determining the normalcy domain and outlier data points comprises:
for each data point in the time series data,
identifying the data point as belong to the normalcy domain of the time series data when a value of the data point is within a normalcy range, and
identifying the data point as an outlier data point, when a value of the data point is not located within any of the domain ranges.

13. The system of claim 10 wherein quantizing the time series data comprises:
for each data point of the time series data in the normalcy domain,
determining a closest centroid of the centroids to the data point; and
assigning a value of the closest centroid to the data point to a corresponding quantized data point in the quantized time series data.

14. The system of claim 10 wherein compressing the quantized time series data comprises:
computing a loss of information between the quantized time series data and the normalcy domain of the time series data; and
for each data point in the normalcy domain of the time series data,
determining each sequence of repeated quantized data points, and
deleting repeated quantized data points in each sequence of repeated quantized data points, leaving one quantized data point from each sequence.

15. The system of claim 14 wherein computing the loss of information between the quantized time series data and the normalcy domain of the time series data comprises computing a distance between the quantized time series data and the normalcy domain of the time series data.

16. The system of claim 10 wherein replacing the time series data in the data-storage device with the compressed time series data and the outlier data points comprises overwriting the time series data with the compressed time series data and the outlier data points.

17. The system of claim 10 wherein replacing the time series data in the data-storage device with the compressed time series data and the outlier data points comprises:
deleting the time series data from the data-storage device; and
writing the compressed time series data and the outlier data points to the data-storage device.

18. The system of claim 10 further comprising:
analyzing the compressed time series data and the outlier data points stored in the data-storage device to determine an anomaly or problem with the object that generated the time series data; and
generating an alert when an anomaly or problem is determined.

19. A non-transitory computer-readable medium encoded with machine-readable instructions that implement a method carried out by one or more processors of computer system to perform the operations of
determining clusters of data points of the time series data recorded in a data-storage device;
determining a normalcy domain and outlier data points of the time series data, the normalcy domain comprising a union of one or more normalcy ranges, each normalcy range containing data points of one of the clusters with data values in an associated interval, and the outlier data points located outside the one or more normalcy ranges;
quantizing time series data in the normalcy domain of the time series data to generate quantized time series data;
compressing the quantized time series data to obtain compressed time series data when loss of information due to quantization is less than or equal to a loss of information limit; and
replacing the time series data in the data-storage device with the compressed time series data and outlier data points to reduce an amount of data stored in the data-storage device.

20. The medium of claim 19 wherein determining clusters of data points of the time series data comprises:
determining quantiles that partition the time series data into groups of data points, each quantile representing an initial centroid of one cluster of the time series data;
computing distances between each data point and the centroids;
for each data point in the time series data, assigning each data point to the cluster with a minimum distance between the data point and the centroid of the cluster;
computing a centroid for each of the clusters based on the data points assigned to the cluster; and
repeating the computing distances between each data point and the centroids, assigning each data points to the cluster with a minimum distance, and computing a centroid for each cluster until assignment of data points to the clusters does not change.

21. The medium of claim 19 wherein determining the normalcy domain and outlier data points comprises:
for each data point in the time series data,
identifying the data point as belong to the normalcy domain of the time series data when a value of the data point is within a normalcy range, and
identifying the data point as an outlier data point, when a value of the data point is not located within any of the domain ranges.

22. The medium of claim 19 wherein quantizing the time series data comprises:
for each data point of the time series data in the normalcy domain,
determining a closest centroid of the centroids to the data point; and
assigning a value of the closest centroid to the data point to a corresponding quantized data point in the quantized time series data.

23. The medium of claim 19 wherein compressing the quantized time series data comprises:
computing a loss of information between the quantized time series data and the normalcy domain of the time series data; and
for each data point in the normalcy domain of the time series data,
determining each sequence of repeated quantized data points, and
deleting repeated quantized data points in each sequence of repeated quantized data points, leaving one quantized data point from each sequence.

24. The medium of claim 23 wherein computing the loss of information between the quantized time series data and the normalcy domain of the time series data comprises computing a distance between the quantized time series data and the normalcy domain of the time series data.

25. The medium of claim 19 wherein replacing the time series data in the data-storage device with the compressed time series data and the outlier data points comprises overwriting the time series data with the compressed time series data and the outlier data points.

26. The medium of claim 19 wherein replacing the time series data in the data-storage device with the compressed time series data and the outlier data points comprises:
deleting the time series data from the data-storage device; and
writing the compressed time series data and the outlier data points to the data-storage device.

27. The medium of claim 19 further comprising:
analyzing the compressed time series data and the outlier data points stored in the data-storage device to determine an anomaly or problem with the object that generated the time series data; and
generating an alert when an anomaly or problem is determined.

* * * * *